(12) United States Patent
Asada et al.

(10) Patent No.: US 12,113,040 B2
(45) Date of Patent: Oct. 8, 2024

(54) SEMICONDUCTOR DEVICE

(71) Applicant: Mitsubishi Electric Corporation, Tokyo (JP)

(72) Inventors: Tomoyuki Asada, Tokyo (JP); Eri Fukuda, Tokyo (JP); Daisuke Tsunami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 415 days.

(21) Appl. No.: 17/607,359

(22) PCT Filed: Aug. 27, 2019

(86) PCT No.: PCT/JP2019/033462
§ 371 (c)(1),
(2) Date: Oct. 28, 2021

(87) PCT Pub. No.: WO2021/038712
PCT Pub. Date: Mar. 4, 2021

(65) Prior Publication Data
US 2022/0223558 A1 Jul. 14, 2022

(51) Int. Cl.
*H01L 23/00* (2006.01)
(52) U.S. Cl.
CPC .... *H01L 24/32* (2013.01); *H01L 2224/32225* (2013.01); *H01L 2924/1011* (2013.01)
(58) Field of Classification Search
CPC ....... H01L 24/32; H01L 24/02; H01L 23/481; H01L 21/52; H01L 24/05; H01L 22/12; H01L 25/50; H01L 24/16; H01L 24/17; H01L 25/105; H01L 21/56; H01L 23/3128; H01L 23/3135; H01L 24/73; H01L 21/76898; H01L 23/5226; H01L 23/46;
(Continued)

(56) References Cited

U.S. PATENT DOCUMENTS 4,956,694 A * 9/1990 Eide ............... H01L 25/105
361/744
5,891,761 A * 4/1999 Vindasius ............ H01R 4/04
257/E29.022
(Continued)

FOREIGN PATENT DOCUMENTS

JP H05-50731 U 7/1993
JP H06-260723 A 9/1994
(Continued)

OTHER PUBLICATIONS

International Search Report issued in PCT/JP2019/033462; mailed Nov. 5, 2019.
(Continued)

*Primary Examiner* — Mouloucoulaye Inoussa
(74) *Attorney, Agent, or Firm* — Studebaker & Brackett PC

(57) ABSTRACT

A semiconductor device according to the invention of the present application includes a support, a semiconductor chip provided on the support and a die bond material for bonding a back surface of the semiconductor chip to the support, wherein a plurality of cutouts is formed at edges formed between the back surface and side surfaces of the semiconductor chip connected to the back surface, and the die bond material is provided integrally over the plurality of cutouts.

13 Claims, 26 Drawing Sheets

(58) Field of Classification Search
CPC ... H01L 23/367; H01L 23/5383; H01L 29/16; H01L 23/562; H01L 25/0657; H01L 23/473; H01L 23/5386; H01L 23/053; H01L 21/4853; H01L 25/18; H01L 23/5385; H01L 23/49827; H01L 23/5384; H01L 21/486; H01L 23/49838; H01L 2224/32056; H01L 2224/32245; H01L 2224/32225; H01L 2924/10156; H01L 2224/05558; H01L 2924/1011; H01L 2224/05548; H01L 2224/83385; H01L 2924/10158; H01L 2224/04026; H01L 2224/02371; H01L 2224/32053; H01L 2924/10272; H01L 2924/19043; H01L 2924/19041; H01L 2224/13025; H01L 2225/06517; H01L 2924/3511; H01L 2225/1058; H01L 2224/04042; H01L 2224/73104; H01L 2224/73207; H01L 2224/73265; H01L 2224/17181; H01L 2224/16268; H01L 2224/13022; H01L 2224/131; H01L 2224/16147; H01L 2224/13147; H01L 2225/06541; H01L 2224/16238; H01L 2225/06562; H01L 2225/06568; H01L 2224/0616; H01L 2224/32145; H01L 2224/05553; H01L 2224/73204; H01L 2224/95; H01L 2223/54426

USPC ......... 257/737, 774, 777, E23.169, E23.174, 257/E21.705; 438/462, 110
See application file for complete search history.

(56) References Cited

U.S. PATENT DOCUMENTS

| | | | |
|---|---|---|---|
| 2003/0230802 A1* | 12/2003 | Poo | H01L 25/105 257/734 |
| 2004/0043535 A1* | 3/2004 | Jeung | H01L 25/105 438/109 |
| 2004/0124523 A1* | 7/2004 | Poo | H01L 23/49805 257/773 |
| 2005/0275114 A1 | 12/2005 | Nozu | |
| 2011/0079912 A1* | 4/2011 | Marcoux | H01L 24/81 257/773 |
| 2012/0133048 A1* | 5/2012 | Lee | H01L 23/49816 257/774 |
| 2015/0076694 A1* | 3/2015 | Kuo | H01L 23/49827 438/618 |

FOREIGN PATENT DOCUMENTS

| | | |
|---|---|---|
| JP | 2001-345542 A | 12/2001 |
| JP | 2002-280253 A | 9/2002 |
| JP | 2005-353740 A | 12/2005 |
| JP | 2010-021251 A | 1/2010 |
| JP | 2018-046289 A | 3/2018 |

OTHER PUBLICATIONS

Office Action issued in TW109120036; mailed by the Taiwanese Patent Office on May 4, 2021.
Office Action issued in TW109120036; mailed by the Taiwanese Patent Office on Sep. 13, 2021.
An Office Action mailed by China National Intellectual Property Administration on Apr. 26, 2024, which corresponds to Chinese Patent Application No. 201980099596.6 and is related to U.S. Appl. No. 17/607,359; with English language translation.

* cited by examiner

SEMICONDUCTOR DEVICE

FIELD

The present invention relates to a semiconductor device and a semiconductor chip.

BACKGROUND

PTL 1 discloses a semiconductor device that includes a semiconductor chip, a die pad for supporting the semiconductor chip, and an adhesive for adhering the semiconductor chip to the die pad. By providing an irregular side surface in a side surface lower portion of the semiconductor chip, the adhesive creeps up more satisfactorily during die bond process, so that the adhesive properties with the die pad can be improved even for a small semiconductor chip.

CITATION LIST

Patent Literature

[PTL 1] JP 2018-046289 A

SUMMARY

Technical Problem

In general, in a semiconductor device for power amplification or the like, it is desirable that heat is efficiently discharged. Therefore, it is preferable that a die bond material for bonding a semiconductor chip to a heat sink or the like is spread over the entire back surface of the chip. This makes it possible to make the heat discharge area with respect to the heat sink as wide as possible. Whether the die bond material is spread over the entire back surface of the semiconductor chip can be determined based on the appearance such as a shape of a protruding portion of the die bond material protruding from the semiconductor chip, for example.

However, when an applied amount of the die bond material is too large, the die bond material may creep up to an upper surface of the semiconductor chip. In this case, the die bond material may reach an electrode formed on the upper surface of the semiconductor chip. This causes failure that the electrode is electrically conductive with the heat sink through the die bond material.

On the other hand, when an amount of the die bond material to be applied is reduced to reduce the creeping-up of the die bond material, the die bond material is less likely to protrude from the semiconductor chip. This may make it impossible to check from the appearance whether the die bond material is spread over the entire back surface of the semiconductor chip.

The present invention has been made to solve the above-described problems, and an object thereof is to provide a semiconductor device and a semiconductor chip which make it possible to easily check an area over which a die bond material is spread.

Solution to Problem

A semiconductor device according to the first invention of the present application includes a support, a semiconductor chip provided on the support and a die bond material for bonding a back surface of the semiconductor chip to the support, wherein a plurality of cutouts is formed at edges formed between the back surface and side surfaces of the semiconductor chip connected to the back surface, and the die bond material is provided integrally over the plurality of cutouts.

A semiconductor device according to the second invention of the present application includes a support, a semiconductor chip provided on the support and a die bond material for bonding a back surface of the semiconductor chip to the support, wherein the semiconductor chip includes a transparent or semitransparent semiconductor substrate provided on the support, a plurality of recesses is formed in an outer peripheral portion of a back surface of the semiconductor substrate, the back surface facing to the support, and the die bond material is provided integrally over the plurality of recesses.

A semiconductor device according to the third invention of the present application includes a support, a semiconductor chip provided on the support and a die bond material for bonding a back surface of the semiconductor chip to the support, wherein the semiconductor chip includes a semiconductor substrate provided on the support, a plurality of recesses is formed in an outer peripheral portion of the semiconductor substrate, each of the recesses passing through the semiconductor substrate from a back surface facing to the support to an upper surface opposite to the back surface, the semiconductor chip includes a plurality of conductors each of which is embedded in a corresponding one of the plurality of recesses from the upper surface side of the semiconductor substrate, and the die bond material is provided integrally over the plurality of recesses.

A semiconductor chip according to the fourth invention of the present application includes a semiconductor substrate, an electrode provided on an upper surface of the semiconductor substrate and a back surface conductor provided on a back surface of the semiconductor substrate, which is a surface opposite to the upper surface, wherein a plurality of first cutouts is formed at edges formed between the back surface and side surfaces of the semiconductor substrate connected to the back surface, and a plurality of second cutouts is formed in the back surface conductor, each of the plurality of second cutouts being connected to a corresponding one of the plurality of first cutouts and passing through the back surface conductor from a first surface facing to the semiconductor substrate to a second surface opposite to the first surface.

Advantageous Effects of Invention

In the semiconductor device according to the first invention of the present application, the state of the die bond material can be checked from the plurality of cutouts formed in the semiconductor chip. Accordingly, this makes it possible to easily check the area over which the die bond material is spread.

In the semiconductor device according to the second invention of the present application, the die bond material which has entered the plurality of recesses can be checked through the transparent or semitransparent semiconductor substrate. Accordingly, this makes it possible to easily check the area over which the die bond material is spread.

In the semiconductor device according to the third invention of the present application, the state of the die bond material can be checked depending on whether the die bond material is conductive with the plurality of conductors. Accordingly, this makes it possible to easily check the area over which the die bond material is spread.

In the semiconductor device according to the fourth invention of the present application, the state of the die bond material can be checked from the plurality of first cutouts and the plurality of second cutouts. Accordingly, this makes it possible to easily check the area over which the die bond material is spread.

DESCRIPTION OF EMBODIMENTS

Figure 1:
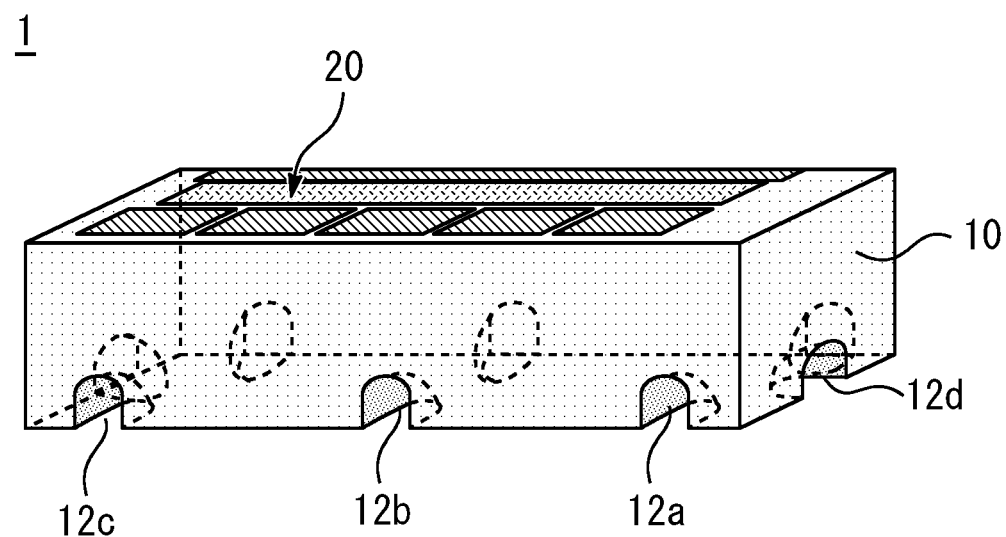
FIG. 1 is a perspective view of a semiconductor chip according to the first embodiment.

Semiconductor devices and semiconductor chips according to embodiments of the present invention are described with reference to drawings. Identical or corresponding constitutional elements are given the same reference numerals, and the repeated description of such constitutional elements may be omitted.

First Embodiment

Figure 2A:
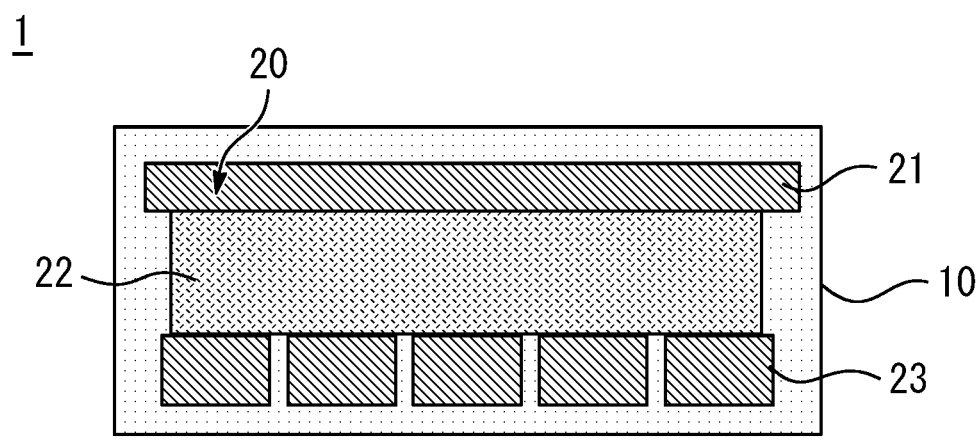
FIG. 2A is a plan view of the semiconductor chip according to the first embodiment.

FIG. 1 is a perspective view of a semiconductor chip 1 according to the first embodiment. FIG. 2A is a plan view of the semiconductor chip 1 according to the first embodiment.

Figure 2B:
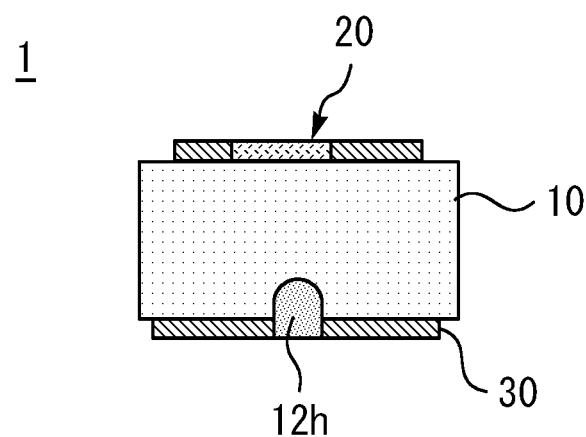
FIG. 2B is a left side view of the semiconductor chip according to the first embodiment.
Figure 2C:
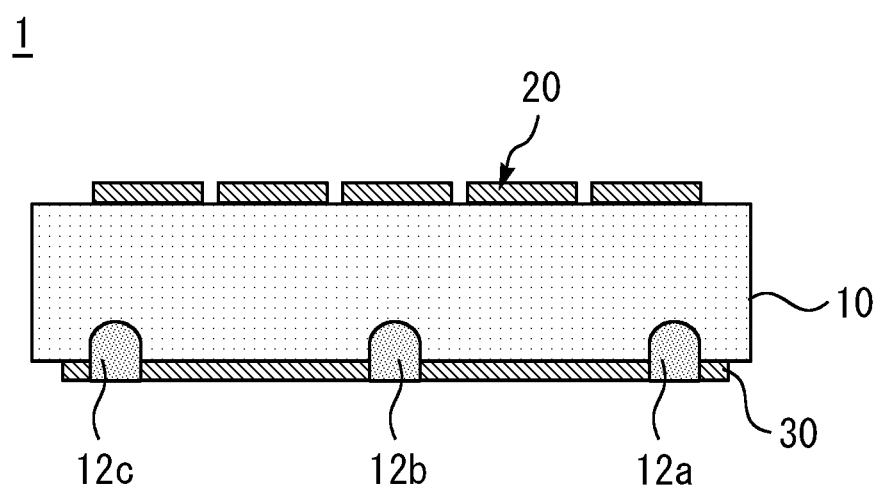
FIG. 2C is a front view of the semiconductor chip according to the first embodiment.
Figure 2D:
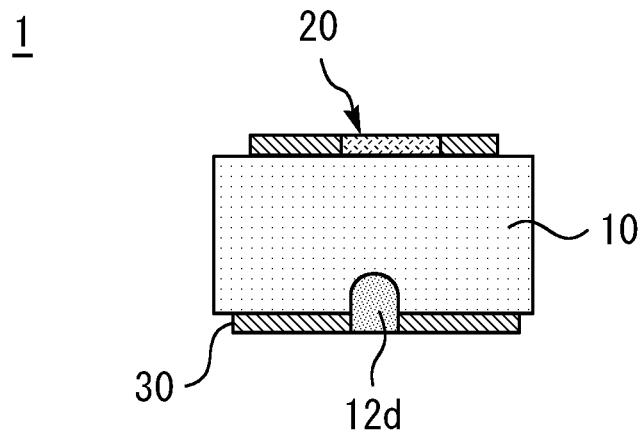
FIG. 2D is a right side view of the semiconductor chip according to the first embodiment.
Figure 2E:
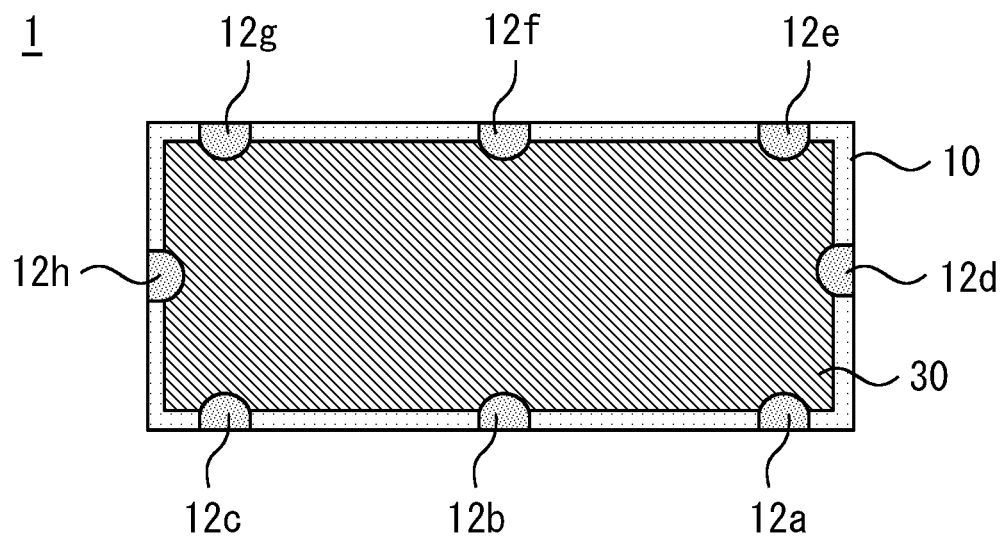
FIG. 2E is a bottom view of the semiconductor chip according to the first embodiment.

FIG. 2B is a left side view of the semiconductor chip 1 according to the first embodiment. FIG. 2C is a front view of the semiconductor chip 1 according to the first embodiment. FIG. 2D is a right side view of the semiconductor chip 1 according to the first embodiment. FIG. 2E is a bottom view of the semiconductor chip 1 according to the first embodiment.

The semiconductor chip 1 includes a semiconductor substrate 10. A semiconductor layer is formed on an upper surface side of the semiconductor substrate 10. The semiconductor layer forms an active element such as a power amplifying semiconductor device. A circuit element may be formed on the upper surface side of the semiconductor substrate 10. An electrode 20 is provided on the upper surface of the semiconductor substrate 10. The electrode 20 serves as an electrode of the active element or the circuit element.

For example, a field effect transistor is formed in the semiconductor chip 1. The semiconductor substrate 10 may be made with SiC. The active element formed in the semiconductor substrate 10 may be a high electron mobility transistor (HEMT) formed from GaN, for example. In this case, the electrode 20 includes a source electrode 21, a gate electrode 22, and a drain electrode 23.

A back surface conductor 30 is provided on the back surface which is a surface opposite to the upper surface of the semiconductor substrate 10. The back surface conductor 30 covers substantially the entire back surface of the semiconductor substrate 10. The back surface conductor 30 is provided in a center portion of the back surface of the semiconductor substrate 10. An outer peripheral portion of the back surface of the semiconductor substrate 10 is exposed from the back surface conductor 30. The entirety of the back surface of the semiconductor substrate 10 may be covered by the back surface conductor 30.

The back surface conductor 30 may be insulated from the electrode 20. Furthermore, the back surface conductor 30 may be electrically connected to the source electrode 21 through a via hole (not illustrated) formed in the semiconductor substrate 10.

A plurality of cutouts 12a to 12h is formed at edges formed between the back surface and side surfaces of the semiconductor chip 1 connected to the back surface. Each of the plurality of cutouts 12a to 12h is formed by cutting out a portion on the back surface side in the side surface of the semiconductor chip 1. The cutouts 12a to 12c and the cutouts 12e to 12g are formed in the two side surfaces extending in the longitudinal direction in the semiconductor chip 1, respectively. The cutouts 12d and 12h are formed in the two side surfaces extending in a short-side direction in the semiconductor chip 1, respectively.

Each of the cutouts 12a to 12h is formed to extend from the semiconductor substrate 10 to the back surface conductor 30. A plurality of first cutouts is formed at edges formed between the back surface of the semiconductor substrate 10, which is a surface facing to the back surface conductor 30, and the side surfaces connected to the back surface. Furthermore, a plurality of second cutouts is formed in the back surface conductor 30. Each of the plurality of second cutouts passes through the back surface conductor 30 from a first surface facing to the semiconductor substrate 10 to a second surface opposite to the first surface. Each of the plurality of second cutouts is connected to the corresponding one of the plurality of first cutouts.

Figure 3:
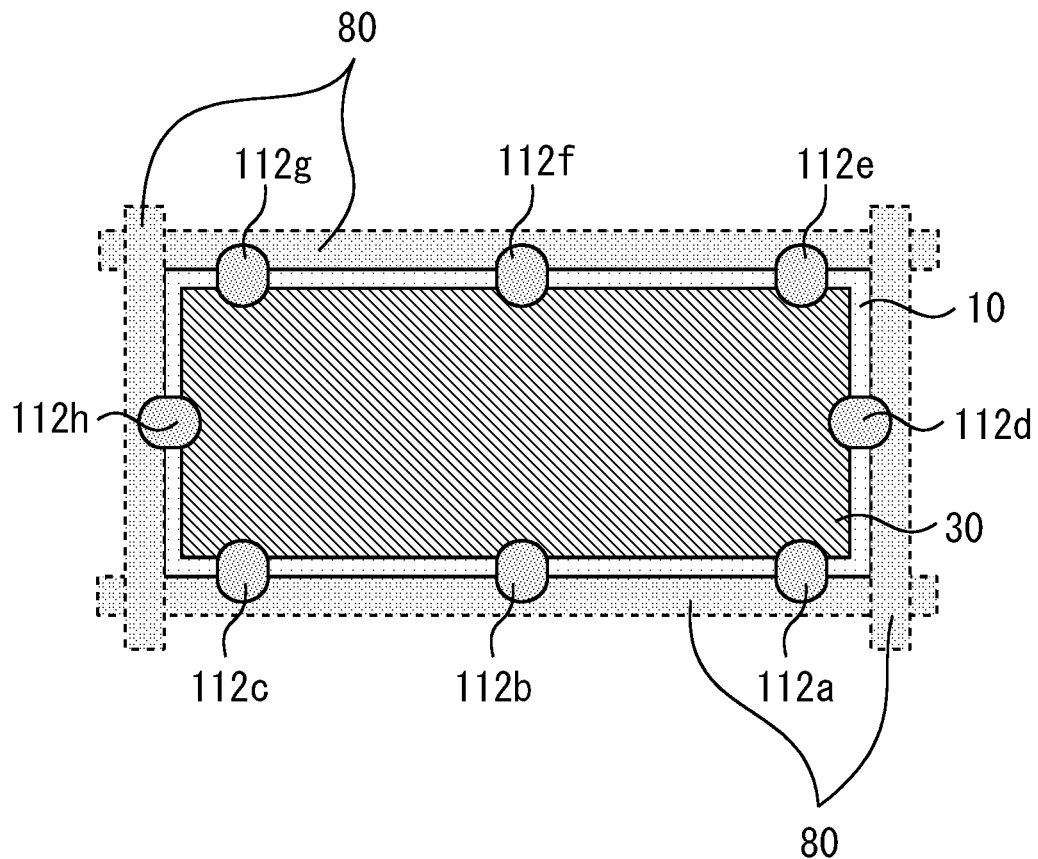
FIG. 3 is a diagram illustrating a method of manufacturing the semiconductor chip according to the first embodiment.

FIG. 3 is a diagram illustrating a method of manufacturing the semiconductor chip 1 according to the first embodiment. FIG. 3 illustrates a method of forming the plurality of cutouts 12a to 12h. A plurality of dug holes 112a to 112h is formed in a wafer state after the semiconductor layer, the electrode 20, and the back surface conductor 30 are formed on the semiconductor substrate 10. Each of the plurality of dug holes 112a to 112h is arranged to extend between a dicing street 80 for separating chips from each other and a region serving as the semiconductor chip 1.

Next, the dicing is performed along the dicing streets 80. Accordingly, the semiconductor chip 1 is separated from the wafer state. As a result, the dug holes 112a to 112h make the cutouts 12a to 12h, respectively.

Figure 4:
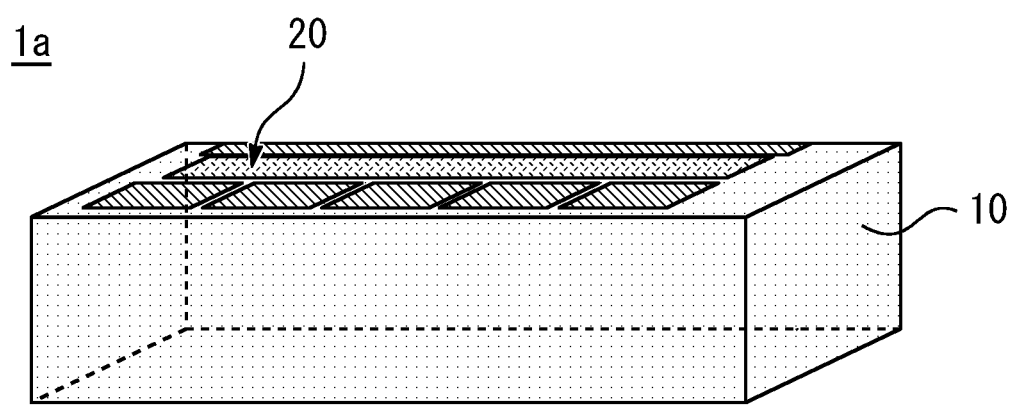
FIG. 4 is a perspective view of a semiconductor chip according to a comparative example.
Figure 5A:
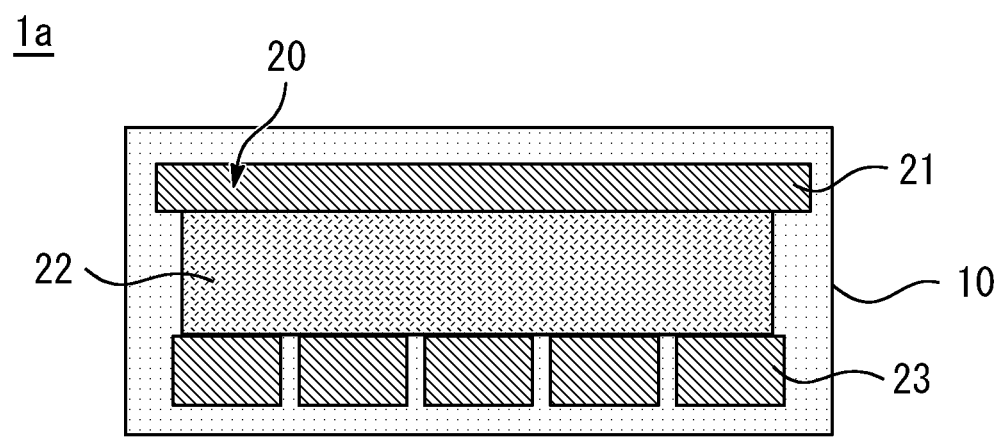
FIG. 5A is a plan view of the semiconductor chip according to the comparative example.
Figure 5B:
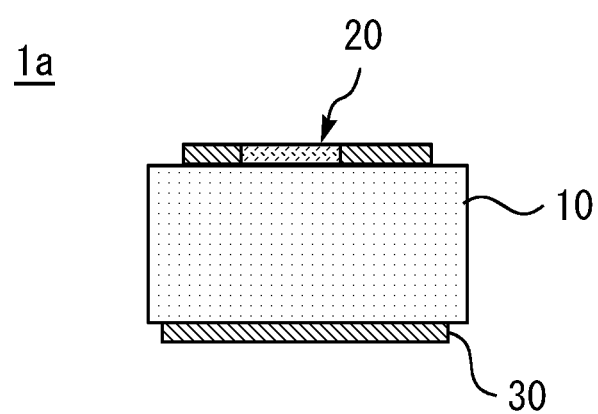
FIG. 5B is a left side view of the semiconductor chip according to the comparative example.
Figure 5C:
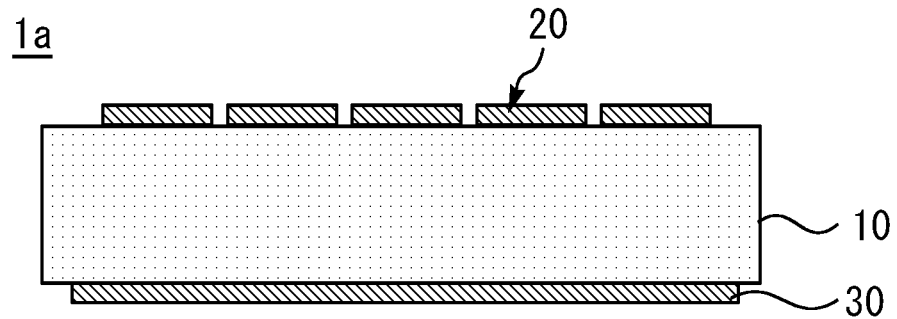
FIG. 5C is a front view of the semiconductor chip according to the comparative example.
Figure 5D:
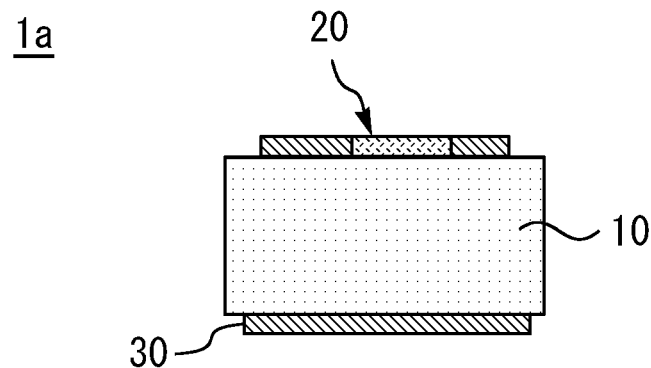
FIG. 5D is a right side view of the semiconductor chip according to the comparative example.
Figure 5E:
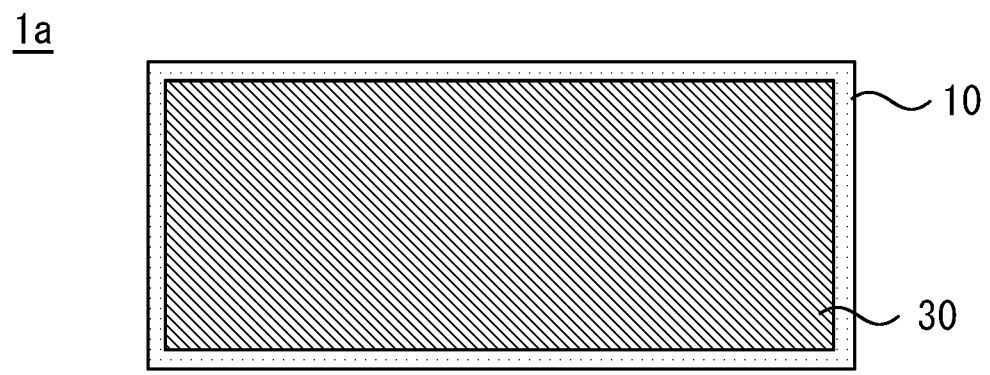
FIG. 5E is a bottom view of the semiconductor chip according to the comparative example.

FIG. 4 is a perspective view of a semiconductor chip 1a according to a comparative example. FIG. 5A is a plan view of the semiconductor chip 1a according to the comparative example. FIG. 5B is a left side view of the semiconductor chip 1a according to the comparative example. FIG. 5C is a front view of the semiconductor chip 1a according to the comparative example. FIG. 5D is a right side view of the semiconductor chip 1a according to the comparative example. FIG. 5E is a bottom view of the semiconductor chip 1a according to the comparative example. The semiconductor chip 1a according to the comparative example is different from the semiconductor chip 1 in that the cutouts 12a to 12h are not provided.

Figure 6A:
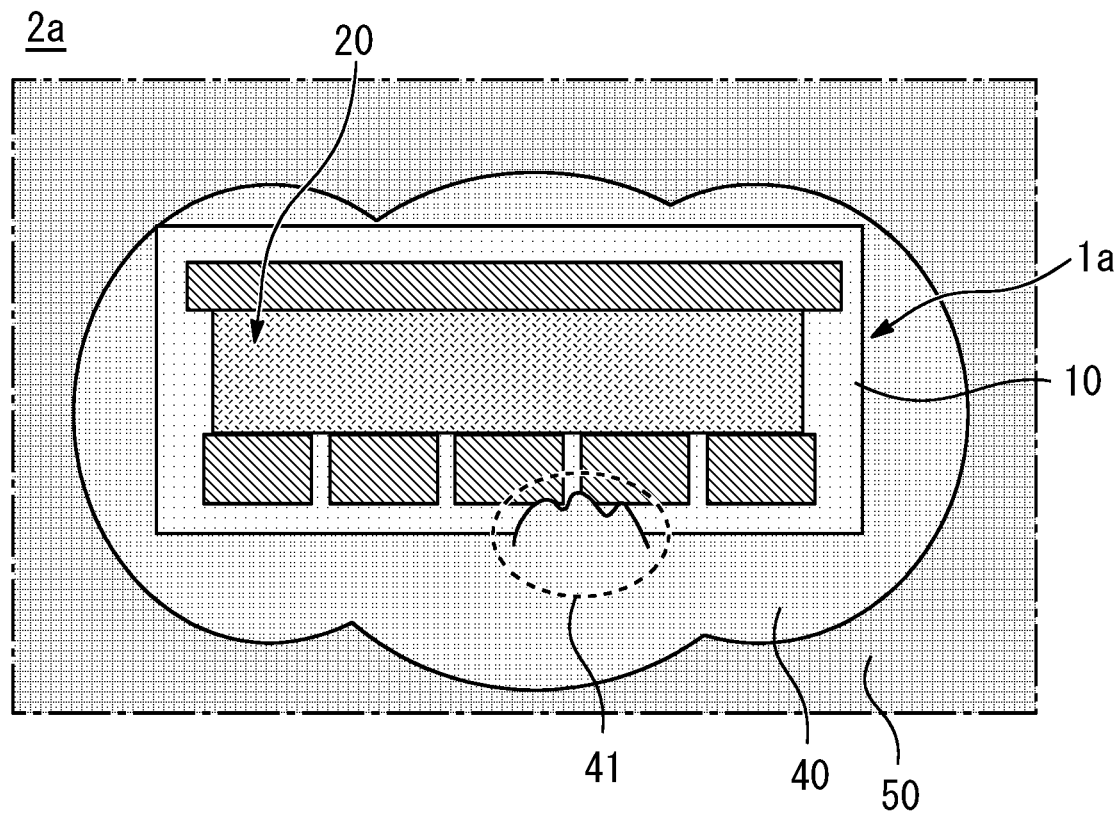
FIG. 6A is a plan view of a semiconductor device according to the comparative example.
Figure 6B:
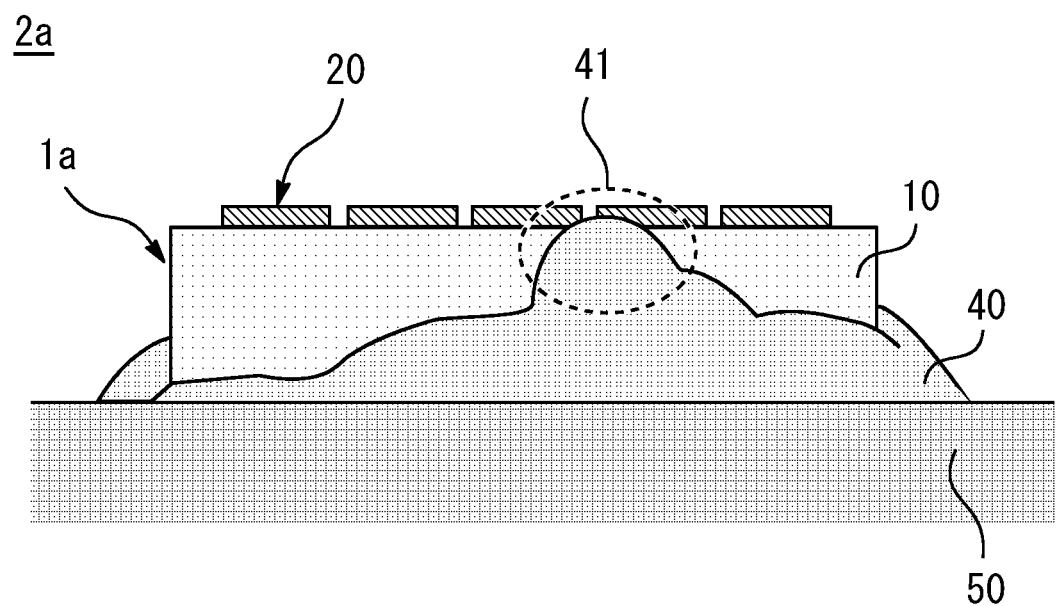
FIG. 6B is a front view of the semiconductor device according to the comparative example.

FIG. 6A is a plan view of a semiconductor device 2a according to the comparative example. FIG. 6B is a front view of the semiconductor device 2a according to the comparative example. In the semiconductor device 2a, the semiconductor chip 1a is bonded to an upper surface of a support 50 by a die bond material 40.

In the semiconductor device 2a, the die bond material 40 is provided on the entire back surface of the semiconductor chip 1a to efficiently radiate heat. In the semiconductor device 2a, an appearance inspection is performed to determine whether the die bond material 40 is spread over the entire back surface of the semiconductor chip 1a. Whether the die bond material 40 is properly spread is determined based on the size, shape, etc. of the portion of the die bond material 40 protruding from the semiconductor chip 1a, when the semiconductor chip 1a is viewed from the upper surface side, for example.

In the semiconductor device 2a, it is conceivable that a large amount of die bond material 40 is required when the die bond material 40 is applied to protrude from the entire outer peripheral portion of the semiconductor chip 1a, for example. In this case, the die bond material 40 may creep up to the upper surface of the semiconductor chip 1a, as indicated by a portion surrounded by a dotted line 41. Accordingly, the electrode 20 and the support 50 may be electrically conductive with each other through the die bond material 40.

Figure 7A:
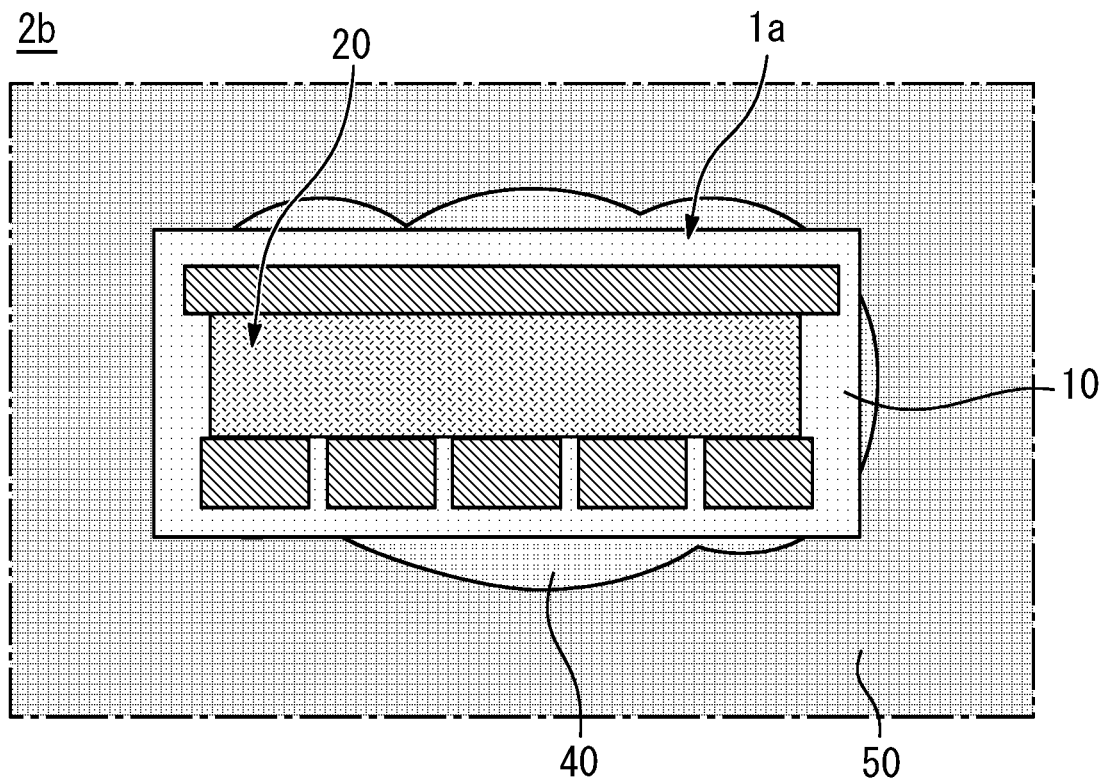
FIG. 7A is a plan view of a semiconductor device according to another comparative example.
Figure 7B:
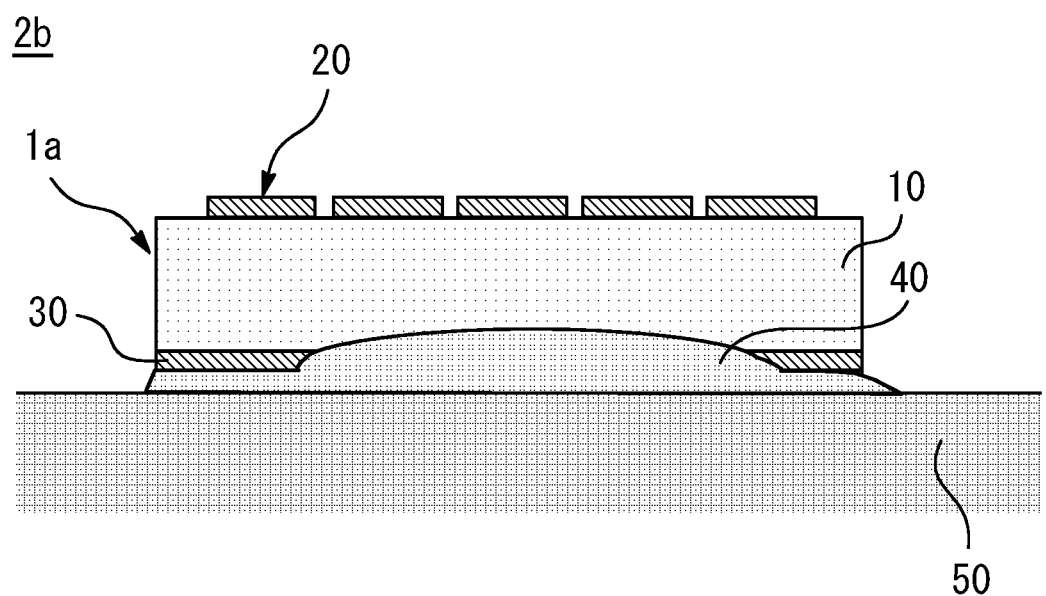
FIG. 7B is a front view of the semiconductor device according to another comparative example.

FIG. 7A is a plan view of a semiconductor device 2b according to another comparative example. FIG. 7B is a front view of the semiconductor device 2b according to another comparative example. In the semiconductor device 2b, an amount of the die bond material 40 is smaller than the amount of die bond material 40 in the semiconductor device 2a. This can prevent the die bond material 40 from creeping up. However, when the amount of die bond material 40 is reduced, a portion where the die bond material 40 does not protrude from the semiconductor chip 1a is easily formed in the outer peripheral portion of the semiconductor chip 1a. This makes it impossible to check from the appearance whether the die bond material 40 is spread over the entire back surface of the semiconductor chip 1a.

Figure 8:
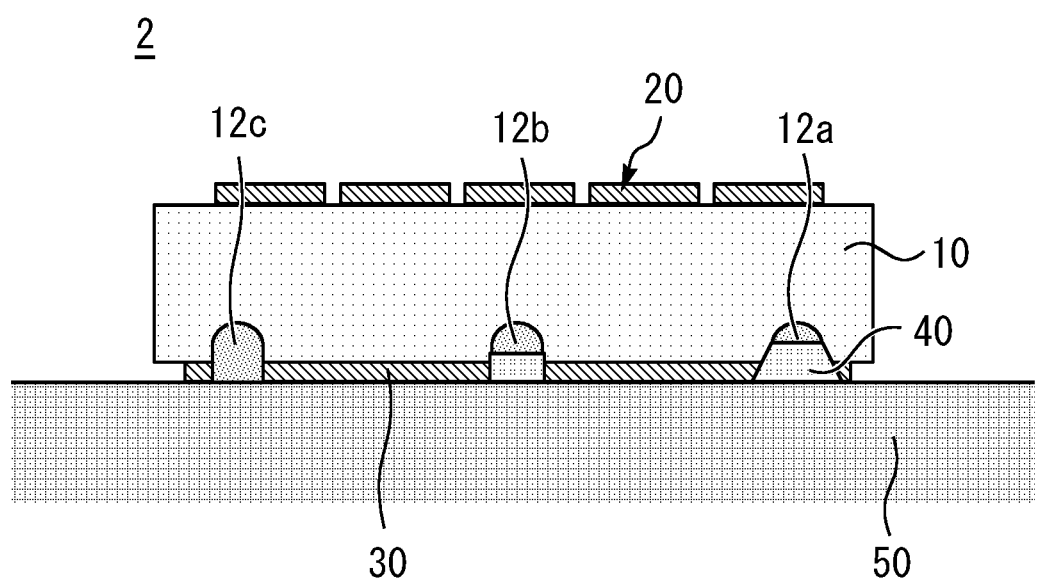
FIG. 8 is a front view of a semiconductor device according to the first embodiment.

FIG. 8 is a front view of a semiconductor device 2 according to the first embodiment. The semiconductor device 2 includes a support 50, a semiconductor chip 1 provided on the support 50, and a die bond material 40 for bonding a back surface of the semiconductor chip 1 to the support 50. The support 50 is, for example, a heat sink. The support 50 may be a substrate or a package.

The semiconductor chip 1 is die-bonded to the support 50 by the die bond material 40. The die bond material 40 is, for example, a conductive die bond material. The die bond material 40 is filled into a space between the upper surface of the support 50 and the back surface of the semiconductor chip 1, and fixes the semiconductor chip 1 to the support 50. The die bond material 40 can be used to efficiently discharge or radiate, to the support 50, the heat generated from the active element or the circuit element formed in the semiconductor chip 1.

Figure 9:
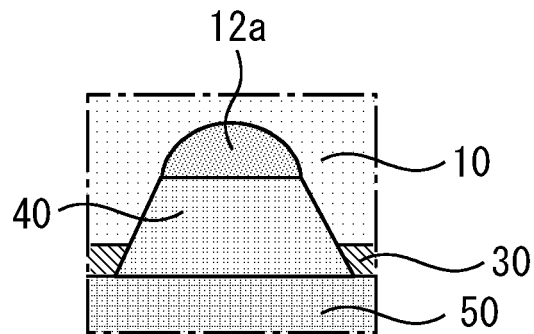
FIG. 9 is an enlarged view of the cutout according to the first embodiment.
Figure 10:
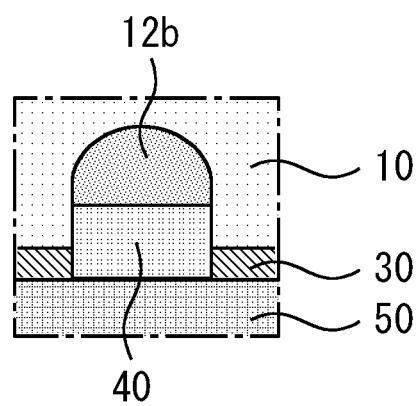
FIG. 10 is an enlarged view of the cutout according to the first embodiment.
Figure 11:
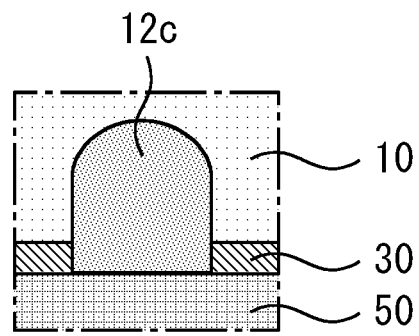
FIG. 11 is an enlarged view of the cutout according to the first embodiment.

FIG. 9 is an enlarged view of the cutout 12a according to the first embodiment. FIG. 10 is an enlarged view of the cutout 12b according to the first embodiment. FIG. 11 is an enlarged view of the cutout 12c according to the first embodiment. FIGS. 9 to 11 each illustrate a state in which the corresponding one of the cutouts 12a to 12c and the die bond material 40 are viewed from the side surface side of the semiconductor chip 1. As for each of the cutouts 12a to 12h, it can be checked whether the die bond material 40 is spread to the cutout. That is, in each of the cutouts 12a to 12h, an applied amount of the die bond material 40 can be checked.

Next, a method of inspecting the semiconductor device 2 in the present embodiment will be described. Firstly, the back surface of the semiconductor chip 1 and the support 50 are bonded by the die bond material 40. Next, as for each of the cutouts 12a to 12h, it is visually checked whether the die bond material 40 is spread to the cutout.

As illustrated in FIGS. 9 and 10, the die bond material 40 can be visually observed from the cutouts 12a and 12b. Accordingly, in the back surface of the semiconductor chip 1, it can be checked that the die bond material 40 is spread to the cutouts 12a and 12b.

On the other hand, as illustrated in FIG. 11, the die bond material 40 cannot be visually observed from the cutout 12c. Accordingly, in the back surface of the semiconductor chip 1, it can be checked that the die bond material 40 is not spread to the cutout 12c. That is, it can be visually checked that the die bond material 40 is not spread to the target area. The target area is an area in the back surface of the semiconductor chip 1, in which the die bond material 40 needs to be provided.

FIGS. 8 to 11 each illustrate an example in which the die bond material 40 is not exposed from the cutout 12c for the purpose of the description. In actual, in the semiconductor device 2 which is a good product, the die bond material 40 is exposed from all of the plurality of cutouts 12a to 12h. That is, the die bond material 40 is provided integrally over the plurality of cutouts 12a to 12h.

The size of each of the cutouts 12a to 12h is to be set such that it can be checked from the appearance whether the die bond material 40 reaches the cutout. The size of each of the cutouts 12a to 12h is set according to the magnification of a magnifier used for the appearance inspection, for example.

In the present embodiment, an example in which the appearance inspection is performed visually is described. Without being limited thereto, the appearance inspection may be performed using an imaging device such as a camera.

In the present embodiment, it can be checked from the appearance on the side surface side of the semiconductor chip 1 whether the die bond material 40 is spread over the entire back surface of the semiconductor chip 1 or to the target area in the back surface of the semiconductor chip 1.

In the present embodiment, the appearance inspection can be performed even when the die bond material 40 does not protrude from the semiconductor chip 1. This can reduce the amount of the die bond material 40 to be applied. Thus, the die bond material 40 can be prevented from creeping up to the upper surface of the semiconductor substrate 10. Accordingly, the electrode 20 can be prevented from being electrically conductive with the support 50 through the die bond material 40.

Note that in the example in FIG. 9, the die bond material 40 overflows the cutout 12a. However, the die bond material 40 does not reach the electrode 20 provided on the upper surface of the semiconductor substrate 10, and therefore no problem exists.

As described above, in the semiconductor device 2 and the semiconductor chip 1 of the present embodiment, the cutouts 12a to 12h help to easily check the area over which the die bond material 40 is spread. Thus, it can be surely checked whether the die bond material 40 is spread over the target area. In the power amplifying semiconductor chip 1 having large heat generation, it is particularly important to ensure the heat discharge area. The electrode 20 can be prevented from contacting the die bond material 40, thereby improving the reliability of the semiconductor device 2. The consumption amount of the die bond material 40 can be reduced, and the manufacturing cost of the semiconductor device 2 can be reduced.

At least one of the plurality of cutouts 12a to 12h is formed in each side of the back surface of the semiconductor chip 1. That is, at least one of the plurality of first cutouts is formed in each side of the back surface of the semiconductor substrate 10. Thus, it can be surely checked that the die bond material 40 is spread to each side of the back surface of the semiconductor chip 1.

In the present embodiment, the die bond material 40 covers the entirety of the back surface of the semiconductor chip 1. As a modified example, a portion of the back surface of the semiconductor chip 1 may be exposed from the die bond material 40. That is, the die bond material 40 need not be provided over the entire back surface of the semiconductor chip 1 depending on the heat radiation performance to be required. If the heat can be sufficiently radiated, the back surface conductor 30 need not be provided.

In the present embodiment, the eight cutouts 12a to 12h are formed in the semiconductor chip 1. The number of the plurality of cutouts 12a to 12h may be any number of two or more. The arrangement and the number of the plurality of cutouts 12a to 12h may be changed according to the shape of the semiconductor chip 1 or the area in which the die bond material 40 is provided. Furthermore, each of the plurality of cutouts 12a to 12h is formed into a semiellipse shape when viewed from a direction perpendicular to the side surface or back surface of the semiconductor substrate 10. Without being limited thereto, the plurality of cutouts 12a to 12h may be of any shape such that the state of the die bond material 40 can be checked from the appearance.

These modifications can be applied, as appropriate, to a semiconductor device and a semiconductor chip according to the following embodiments. Note that the semiconductor devices and the semiconductor chips according to the following embodiments are similar to those of the first embodiment in many respects, and thus differences between the semiconductor devices and the semiconductor chips according to the following embodiments and those of the first embodiment will be mainly described below.

Second Embodiment

Figure 12A:
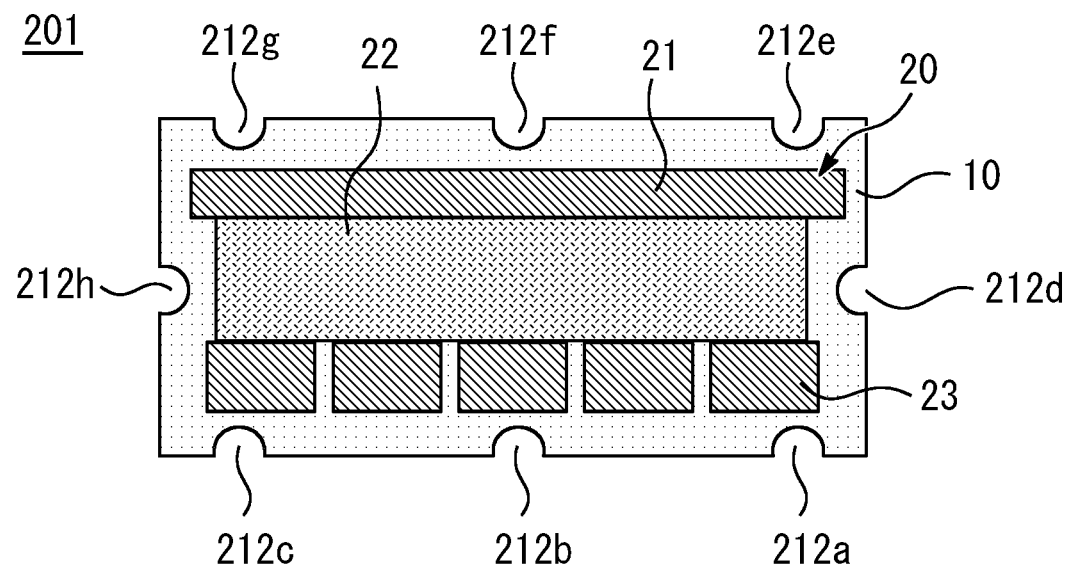
FIG. 12A is a plan view of a semiconductor chip according to the second embodiment.
Figure 12B:
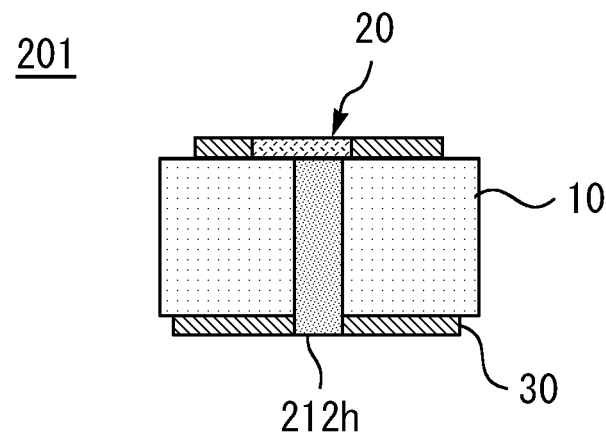
FIG. 12B is a left side view of the semiconductor chip according to the second embodiment.
Figure 12C:
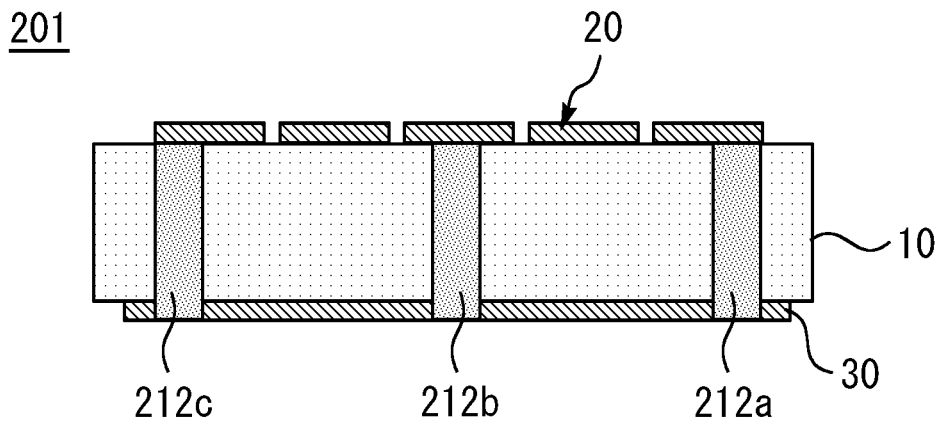
FIG. 12C is a front view of the semiconductor chip according to the second embodiment.
Figure 12D:
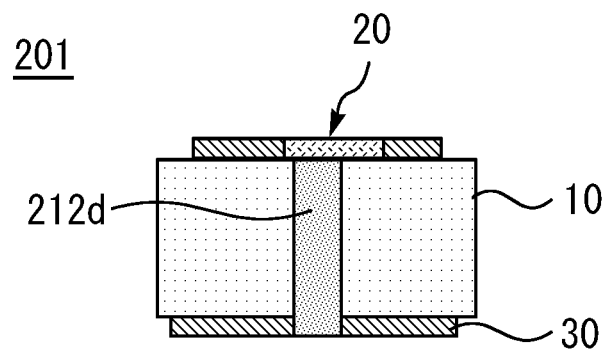
FIG. 12D is a right side view of the semiconductor chip according to the second embodiment.
Figure 12E:
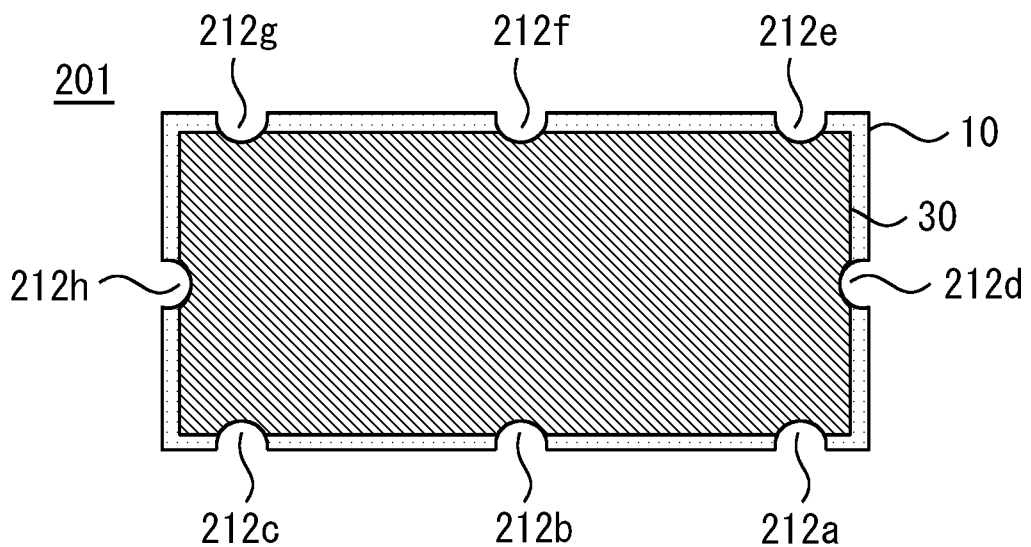
FIG. 12E is a bottom view of the semiconductor chip according to the second embodiment.

FIG. 12A is a plan view of a semiconductor chip 201 according to the second embodiment. FIG. 12B is a left side view of the semiconductor chip 201 according to the second embodiment. FIG. 12C is a front view of the semiconductor chip 201 according to the second embodiment. FIG. 12D is a right side view of the semiconductor chip 201 according to the second embodiment. FIG. 12E is a bottom view of the semiconductor chip 201 according to the second embodiment.

The semiconductor chip 201 of the present embodiment is different from the semiconductor chip of the first embodiment in that cutouts 212a to 212h are formed instead of the cutouts 12a to 12h. The other structure is similar to that of the first embodiment. Each of the cutouts 212a to 212h passes through the semiconductor chip 201 from a back surface thereof to an upper surface thereof opposite to the back surface.

A method of forming the cutouts 212a to 212h is similar to the method of forming the cutouts 12a to 12h of the first embodiment. In a wafer state, each of a plurality of through holes is formed to extend between a dicing street and a region serving as the semiconductor chip 201. Next, the plurality of through holes makes the cutouts 212a to 212h by performing the dicing along the dicing streets.

Figure 13:
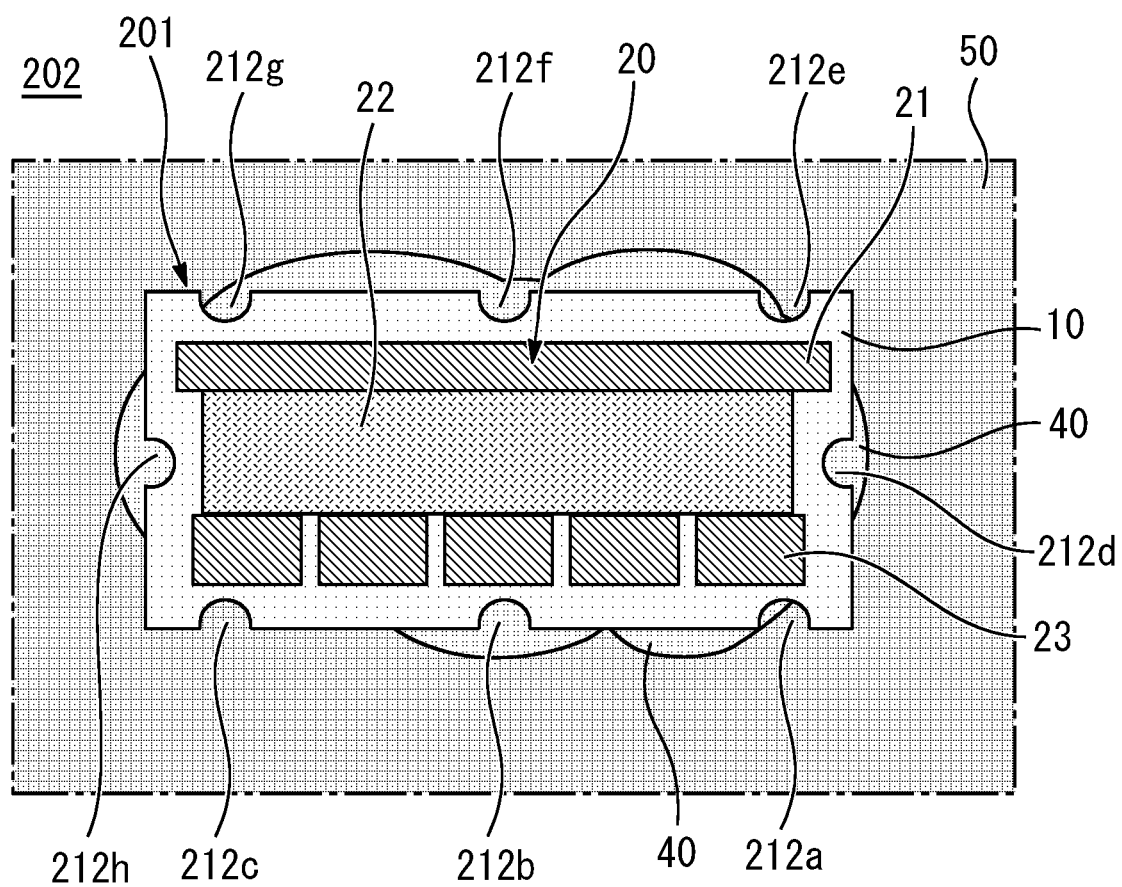
FIG. 13 is a plan view of a semiconductor device according to the second embodiment.

FIG. 13 is a plan view of a semiconductor device 202 according to the second embodiment. In the semiconductor device 202, the semiconductor chip 201 is bonded to a support 50 by a die bond material 40.

Figure 14:
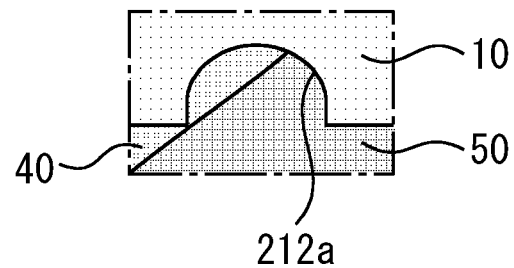
FIG. 14 is an enlarged view of the cutout according to the second embodiment.
Figure 15:
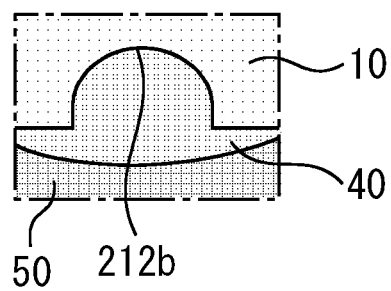
FIG. 15 is an enlarged view of the cutout according to the second embodiment.
Figure 16:
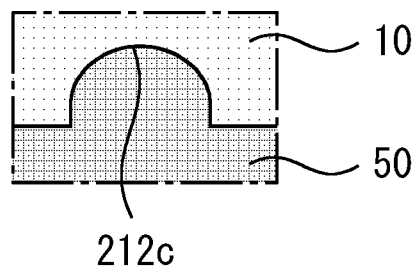
FIG. 16 is an enlarged view of the cutout according to the second embodiment.

FIG. 14 is an enlarged view of the cutout 212a according to the second embodiment. FIG. 15 is an enlarged view of the cutout 212b according to the second embodiment. FIG. 16 is an enlarged view of the cutout 212c according to the second embodiment. FIGS. 14 to 16 each illustrate a state in which the corresponding one of the cutouts 212a to 212c and the die bond material 40 are viewed from the upper surface side of the semiconductor chip 201. As for each of the cutouts 212a to 212h, it can be checked whether the die bond material 40 is spread to the cutout.

As illustrated in FIGS. 14 and 15, the die bond material 40 can be visually observed from the cutouts 212a and 212b. Accordingly, in the back surface of the semiconductor chip 201, it can be checked that the die bond material 40 is spread to the cutouts 212a and 212b. On the other hand, as illustrated in FIG. 16, the die bond material 40 cannot be visually observed from the cutout 212c. Accordingly, in the back surface of the semiconductor chip 201, it can be checked that the die bond material 40 is not spread to the cutout 212c.

Note that FIGS. 13 to 16 each illustrate an example in which the die bond material 40 is not exposed from the cutout 212c for the purpose of the description. In actual, in the semiconductor device 202 which is a good product, the die bond material 40 is exposed from all of the plurality of cutouts 212a to 212h.

Also in the present embodiment, the cutouts 212a to 212h help to easily check the area over which the die bond material 40 is spread. Also in the present embodiment, the appearance inspection can be performed even when the die bond material 40 does not protrude from the semiconductor chip 201. This can reduce the amount of the die bond material 40 to be applied, and the die bond material 40 can be prevented from creeping up to the upper surface of the semiconductor substrate 10. Accordingly, the reliability of the semiconductor device 202 can be improved. Furthermore, the consumption amount of the die bond material 40 can be reduced, and the manufacturing cost of the semiconductor device 202 can be reduced.

Note that in the example in FIG. 15, the die bond material 40 overflows the cutout 212b. Also in this case, it is only required that the die bond material 40 does not reach the electrode 20 provided on the upper surface of the semiconductor substrate 10. It can be visually checked from the side surface side of the semiconductor chip 201 that the die bond material 40 does not reach the upper surface of the semiconductor substrate 10.

In the present embodiment, the appearance inspection is performed from the upper surface of the semiconductor chip 201. Without being limited thereto, the area over which the die bond material 40 is spread may be determined by performing the appearance inspection from the side surface side of the semiconductor chip 201.

Each of the plurality of cutouts 212a to 212h is formed into a semiellipse shape when viewed from a direction perpendicular to the upper surface of the semiconductor substrate 10. Without being limited thereto, the plurality of cutouts 212a to 212h may be of any shape such that the state of the die bond material 40 can be checked from the appearance.

Third Embodiment

Figure 17A:
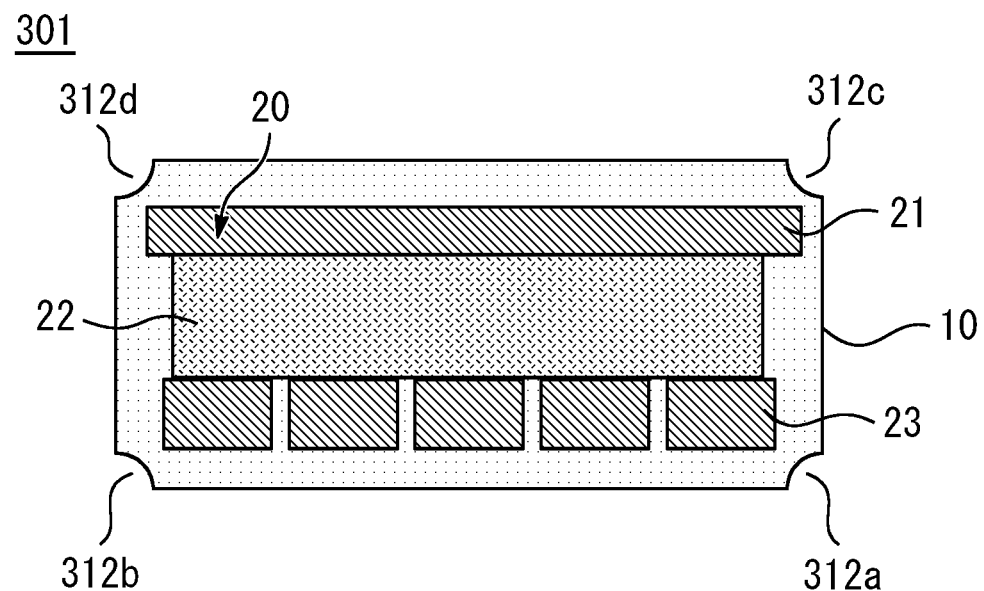
FIG. 17A is a plan view of a semiconductor chip according to the third embodiment.
Figure 17B:
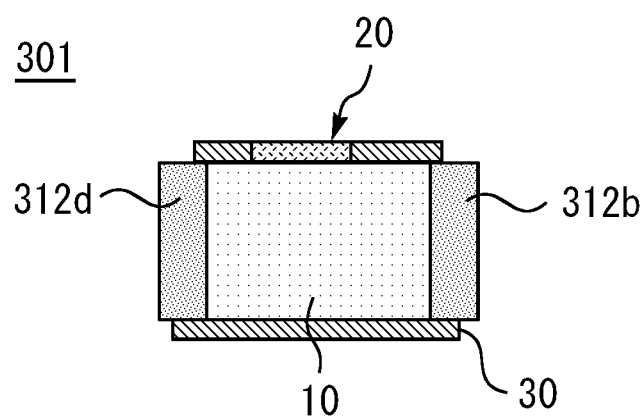
FIG. 17B is a left side view of the semiconductor chip according to the third embodiment.
Figure 17C:
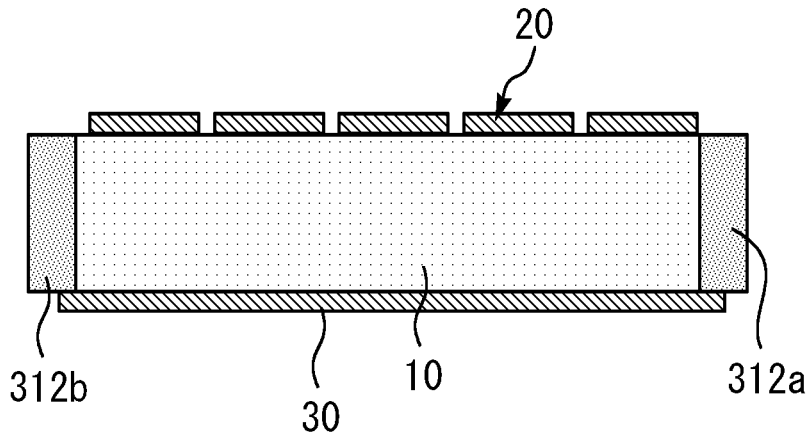
FIG. 17C is a front view of the semiconductor chip according to the third embodiment.
Figure 17D:
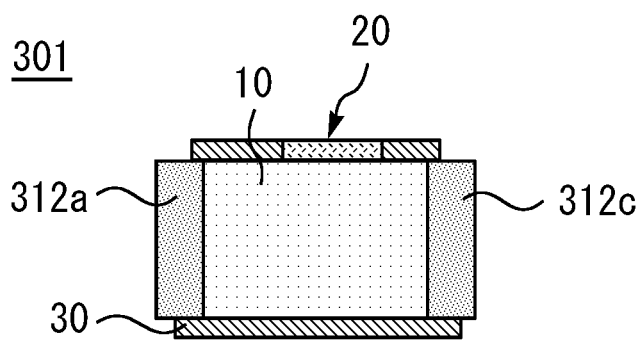
FIG. 17D is a right side view of the semiconductor chip according to the third embodiment.
Figure 17E:
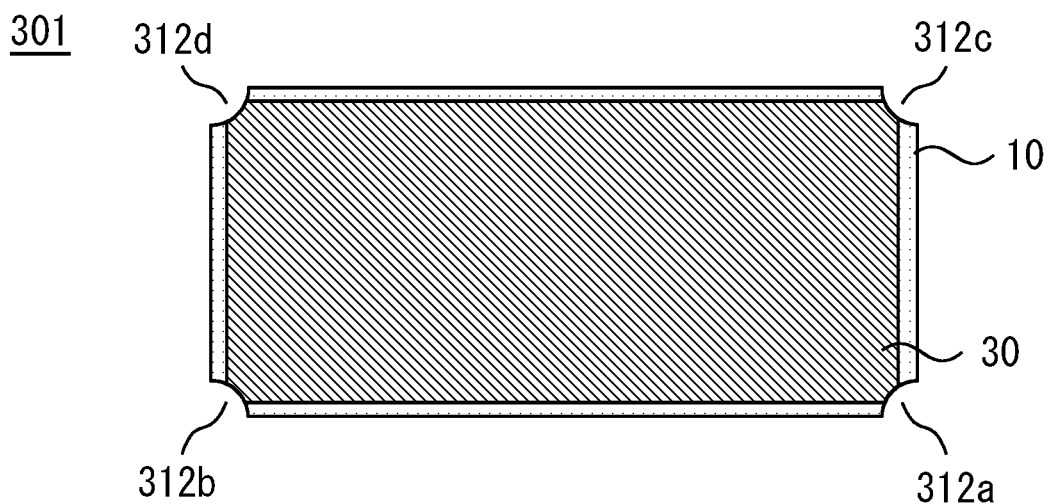
FIG. 17E is a bottom view of the semiconductor chip according to the third embodiment.

FIG. 17A is a plan view of a semiconductor chip 301 according to the third embodiment. FIG. 17B is a left side view of the semiconductor chip 301 according to the third embodiment. FIG. 17C is a front view of the semiconductor chip 301 according to the third embodiment. FIG. 17D is a right side view of the semiconductor chip 301 according to the third embodiment. FIG. 17E is a bottom view of the semiconductor chip 301 according to the third embodiment.

The semiconductor chip 301 of the present embodiment is different from the semiconductor chip of the first embodiment in that cutouts 312a to 312d are formed instead of the cutouts 12a to 12h. The other structure is similar to that of the first embodiment. Each of the cutouts 312a to 312d passes through the semiconductor chip 201301 from a back surface thereof to an upper surface thereof opposite to the back surface. Each of the plurality of cutouts 312a to 312d is formed at the corresponding one of all the edges of the back surface of the semiconductor chip 301. That is, the plurality of cutouts 312a to 312d is formed at four corners of the semiconductor chip 301.

A method of forming the cutouts 312a to 312d is similar to the method of forming the cutouts 12a to 12h of the first embodiment. In a wafer state, each of a plurality of through holes is formed to extend between a dicing street and a region serving as the semiconductor chip 301. Next, the plurality of through holes makes the cutouts 312a to 312d by performing the dicing along the dicing streets.

Figure 18:
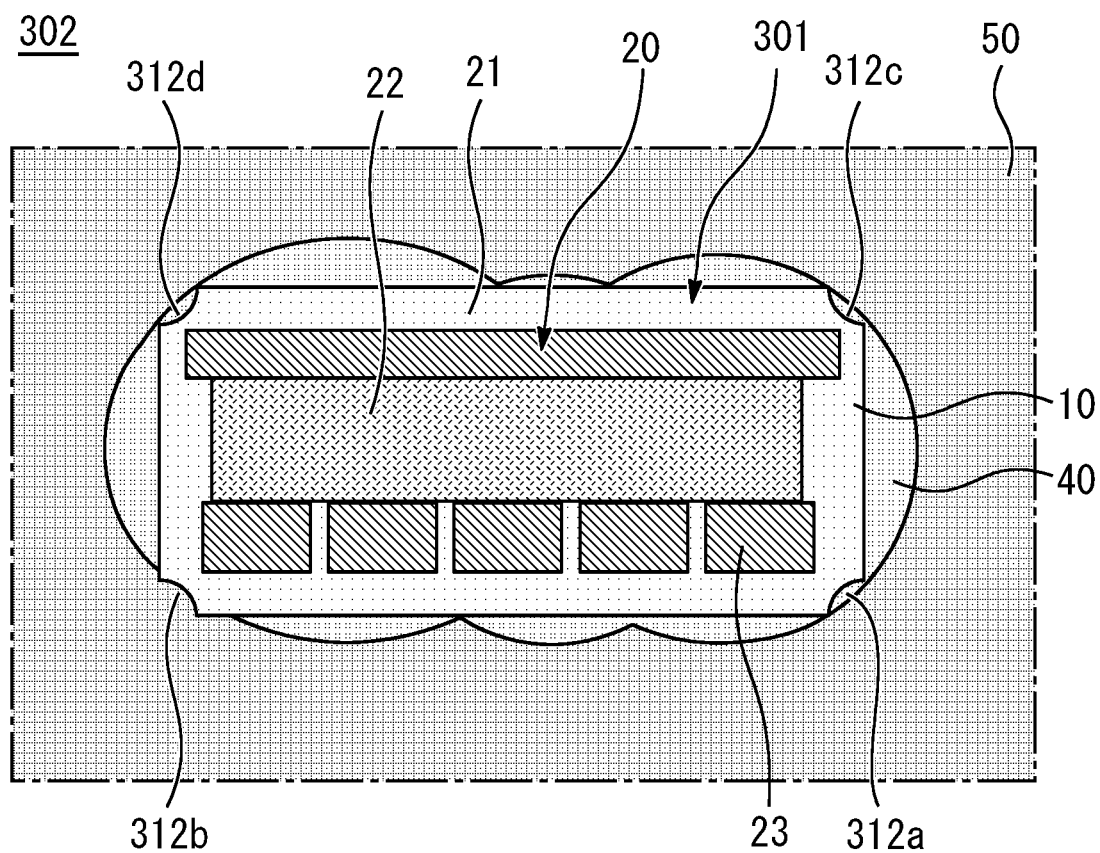
FIG. 18 is a plan view of a semiconductor device according to the third embodiment.

FIG. 18 is a plan view of a semiconductor device 302 according to the third embodiment. In the semiconductor device 302, the semiconductor chip 301 is bonded to a support 50 by a die bond material 40.

Figure 19:
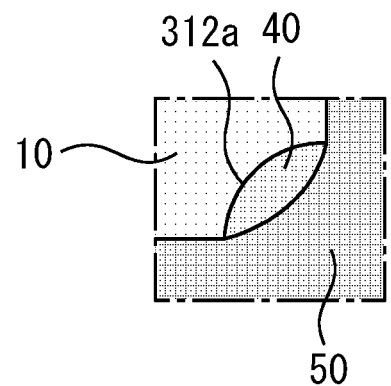
FIG. 19 is an enlarged view of the cutout according to the third embodiment.
Figure 20:
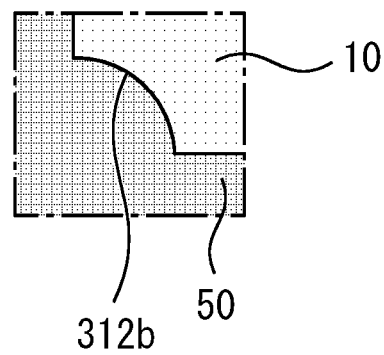
FIG. 20 is an enlarged view of the cutout according to the third embodiment.

FIG. 19 is an enlarged view of the cutout 312a according to the third embodiment. FIG. 20 is an enlarged view of the cutout 312b according to the third embodiment. FIGS. 19 and 20 each illustrate a state in which the corresponding one of the cutouts 312a and 312b and the die bond material 40 are viewed from the upper surface side of the semiconductor chip 301. As for each of the cutouts 312a to 312d, it can be checked whether the die bond material 40 is spread to the cutout.

As illustrated in FIG. 19, the die bond material 40 can be visually observed from the cutout 312a. Accordingly, in the back surface of the semiconductor chip 301, it can be checked that the die bond material 40 is spread to the cutout 312a. On the other hand, as illustrated in FIG. 20, the die bond material 40 cannot be visually observed from the cutout 312b. Accordingly, in the back surface of the semiconductor chip 301, it can be checked that the die bond material 40 is not spread to the cutout 312b.

Note that FIGS. 18 to 20 each illustrate an example in which the die bond material 40 is not exposed from the cutout 312b for the purpose of the description. In actual, in the semiconductor device 302 which is a good product, the die bond material 40 is exposed from all of the plurality of cutouts 312a to 312d.

Also in the present embodiment, the cutouts 312a to 312d help to easily check the area over which the die bond material 40 is spread. Also in the present embodiment, the appearance inspection can be performed even when the die bond material 40 does not protrude from the semiconductor chip 301. This can reduce the amount of the die bond material 40 to be applied, and the die bond material 40 can be prevented from creeping up to the upper surface of the semiconductor substrate 10. Accordingly, the reliability of the semiconductor device 302 can be improved. Furthermore, the consumption amount of the die bond material 40 can be reduced, and the manufacturing cost of the semiconductor device 302 can be reduced.

Note that in the example in FIG. 19, the die bond material 40 overflows the cutout 312a. Also in this case, it is only required that the die bond material 40 does not reach the electrode 20 provided on the upper surface of the semiconductor substrate 10. It can be visually checked from the side surface side of the semiconductor chip 301 that the die bond material 40 does not reach the upper surface of the semiconductor substrate 10.

Each of the plurality of cutouts 312a to 312d is formed into a fan shape when viewed from a direction perpendicular to the upper surface of the semiconductor substrate 10. Without being limited thereto, the plurality of cutouts 312a to 312d may be of any shape such that the state of the die bond material 40 can be checked from the appearance.

Fourth Embodiment

Figure 21A:
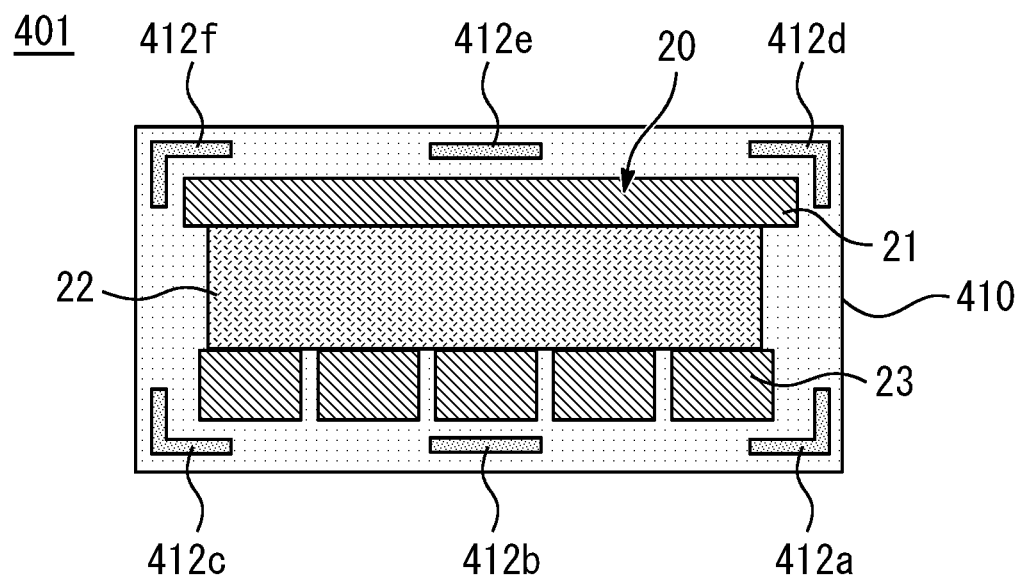
FIG. 21A is a plan view of a semiconductor chip according to the fourth embodiment.
Figure 21B:
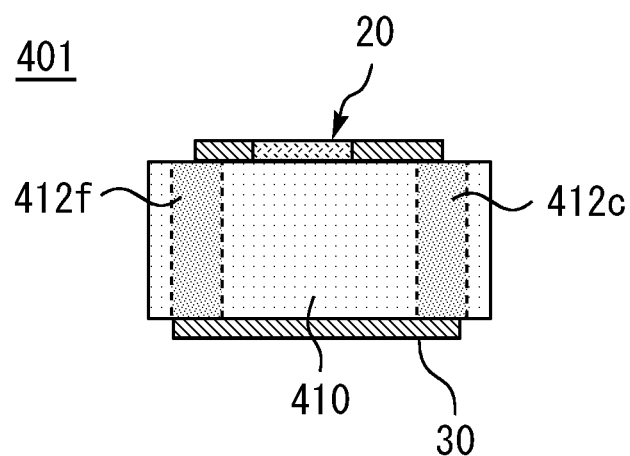
FIG. 21B is a left side view of the semiconductor chip according to the fourth embodiment.
Figure 21C:
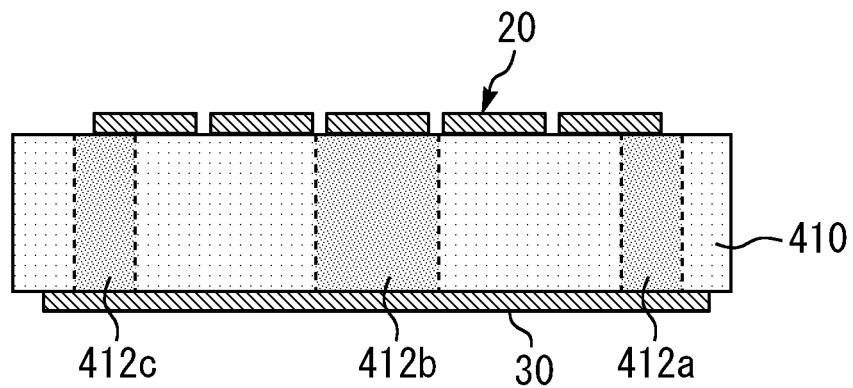
FIG. 21C is a front view of the semiconductor chip according to the fourth embodiment.
Figure 21D:
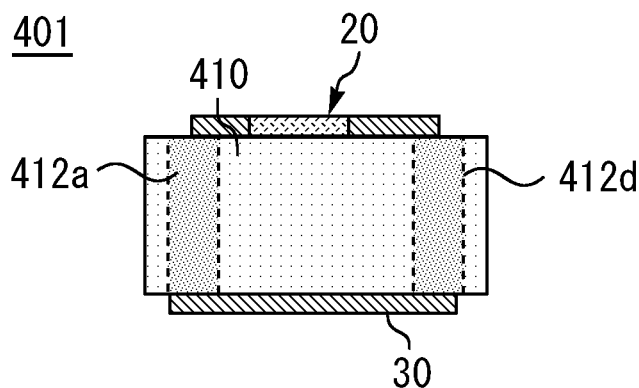
FIG. 21D is a right side view of the semiconductor chip according to the fourth embodiment.
Figure 21E:
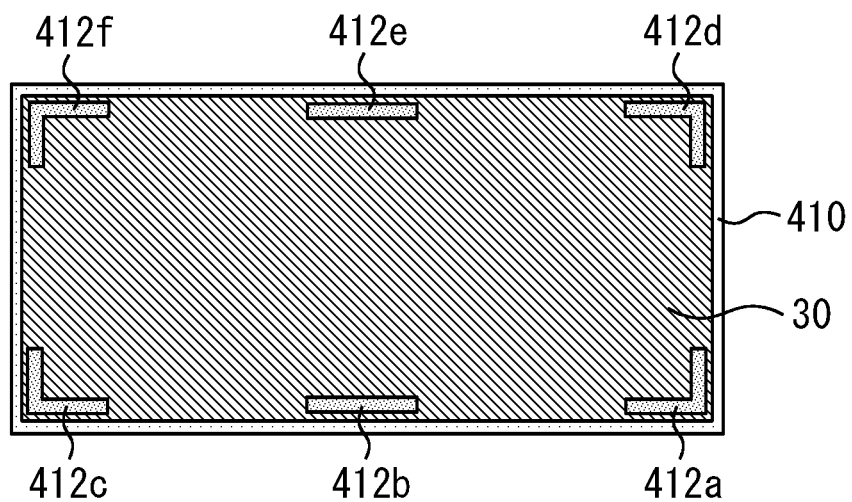
FIG. 21E is a bottom view of the semiconductor chip according to the fourth embodiment.

FIG. 21A is a plan view of a semiconductor chip 401 according to the fourth embodiment. FIG. 21B is a left side view of the semiconductor chip 401 according to the fourth embodiment. FIG. 21C is a front view of the semiconductor chip 401 according to the fourth embodiment. FIG. 21D is a right side view of the semiconductor chip 401 according to the fourth embodiment. FIG. 21E is a bottom view of the semiconductor chip 401 according to the fourth embodiment.

The semiconductor chip 401 of the present embodiment includes a transparent or semitransparent semiconductor substrate 410 instead of the semiconductor substrate 10. The semiconductor substrate 410 may be, for example, an SiC substrate. Instead of the plurality of cutouts 12a to 12h, a plurality of recesses 412a to 412f is formed in an outer peripheral portion of the semiconductor substrate 410. Each of the plurality of recesses 412a to 412f passes through the semiconductor chip 401 from a back surface thereof to an upper surface thereof. The recesses 412a to 412f are formed outside the electrode 20. The other structure is similar to that of the first embodiment.

Figure 22:
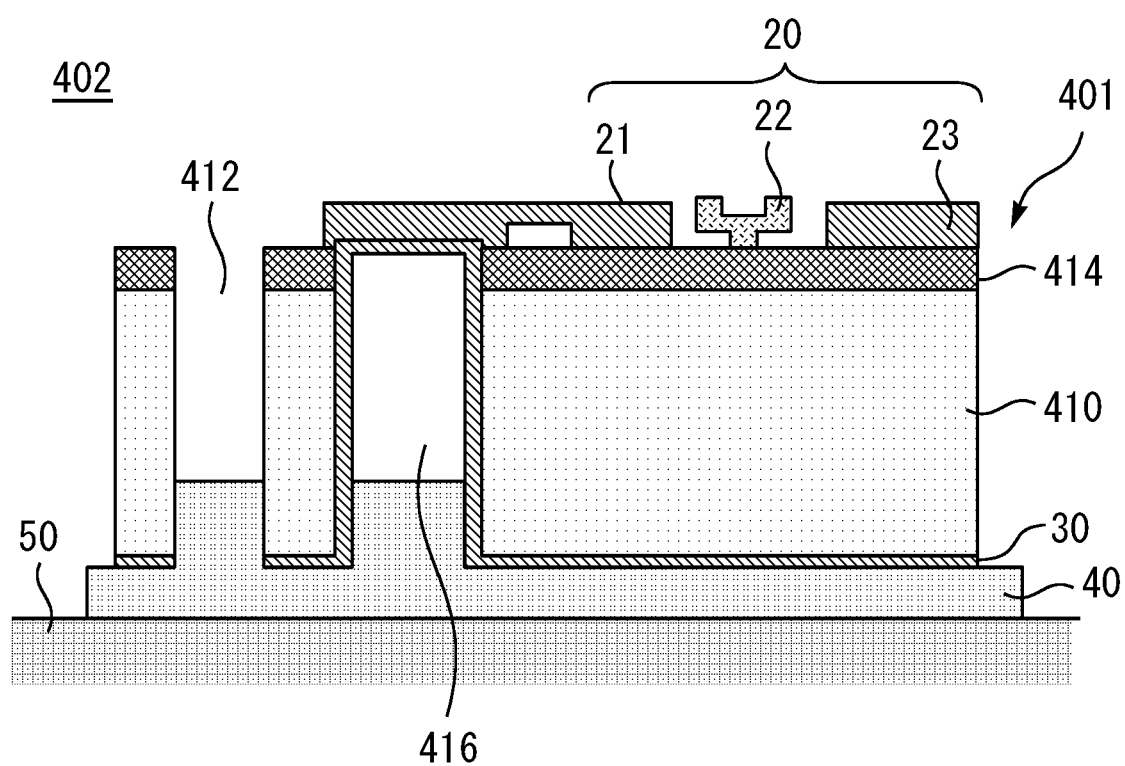
FIG. 22 is a cross-sectional view of a semiconductor device according to the fourth embodiment.

FIG. 22 is a cross-sectional view of a semiconductor device 402 according to the fourth embodiment. In the semiconductor device 402, the semiconductor chip 401 is bonded to a support 50 by a die bond material 40. The semiconductor substrate 410 is provided on the support 50. A back surface conductor 30 and the die bond material 40 are provided between the semiconductor substrate 410 and the support 50. A semiconductor layer 414 is provided on an upper surface side of the semiconductor substrate 410. Furthermore, a via hole 416 is formed in the semiconductor substrate 410. The via hole 416 passes through the semiconductor substrate 410 from the upper surface to the back surface.

A side surface of the semiconductor substrate 410 forming the via hole 416 is covered by plating wiring. The plating wiring and the back surface conductor 30 are connected to each other. Furthermore, on the semiconductor substrate 410, the plating wiring contacts a source electrode 21. This causes the source electrode 21 to be electrically connected to the support 50 through a plating electrode, the back surface conductor 30, and the die bond material 40. Accordingly, the source electrode 21, the plating electrode, the back surface conductor 30, the die bond material 40 and the support 50 are set to the same potential.

A recess 412 illustrated in FIG. 22 is any one of the recesses 412a to 412f. The plating electrode is not provided in the side surface of the semiconductor substrate 410 forming the recess 412. Accordingly, it can be visually checked through the transparent or semitransparent semiconductor substrate 410 whether the die bond material enters the recess 412.

Figure 23:
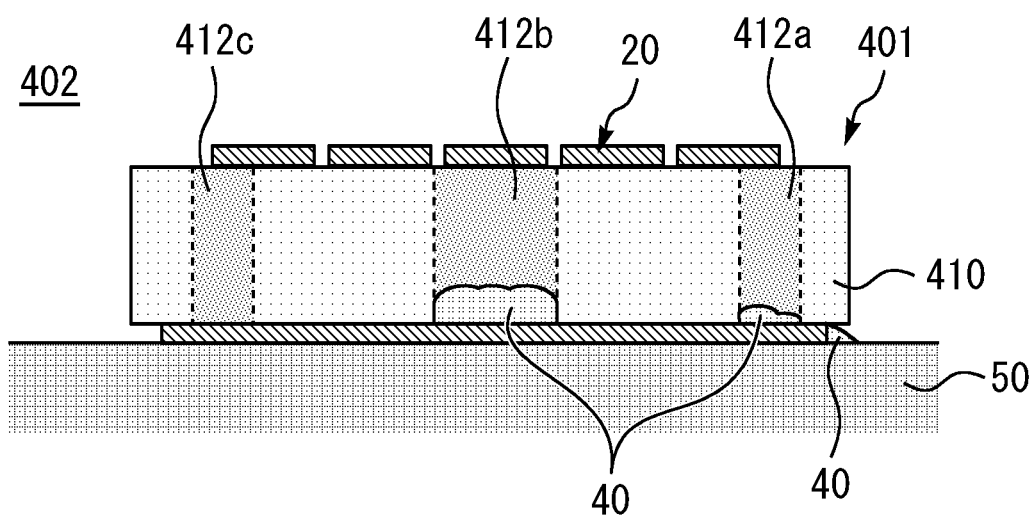
FIG. 23 is a front view of the semiconductor device according to the fourth embodiment.
Figure 24:
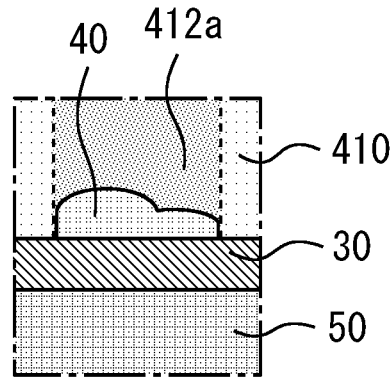
FIG. 24 is an enlarged view of the recess according to the fourth embodiment.
Figure 25:
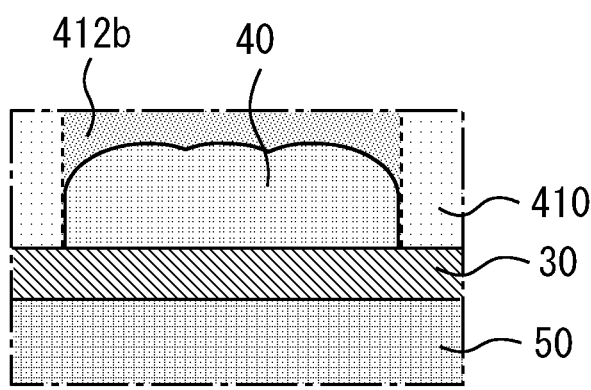
FIG. 25 is an enlarged view of the recess according to the fourth embodiment.
Figure 26:
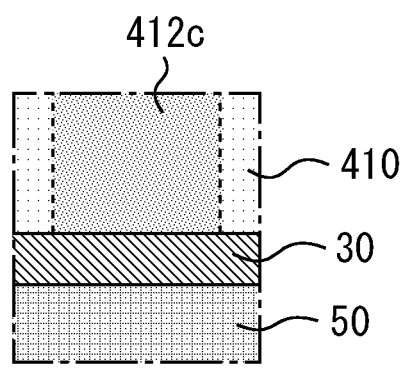
FIG. 26 is an enlarged view of the recess according to the fourth embodiment.

FIG. 23 is a front view of the semiconductor device 402 according to the fourth embodiment. FIG. 24 is an enlarged view of the recess 412a according to the fourth embodiment. FIG. 25 is an enlarged view of the recess 412b according to the fourth embodiment. FIG. 26 is an enlarged view of the recess 412c according to the fourth embodiment. FIGS. 24 to 26 each illustrate a state in which the corresponding one of the recesses 412a to 412c and the die bond material 40 are viewed through the semiconductor substrate 410. FIGS. 24 to 26 each illustrate a state in which the semiconductor chip 401 is viewed from a direction perpendicular to the side surface, for example. As for each of the recesses 412a to 412f, it can be checked whether the die bond material 40 enters the recess.

As illustrated in FIGS. 24 and 25, the die bond material 40 which has entered the recesses 412a and 412b can be visible through the semiconductor substrate 410. Accordingly, in the back surface of the semiconductor chip 401, it can be checked that the die bond material 40 is spread to the recesses 412a and 412b. On the other hand, as illustrated in FIG. 26, the die bond material 40 cannot be visually observed in the recess 412c. Accordingly, in the back surface of the semiconductor chip 401, it can be checked that the die bond material 40 is not spread to the recess 412c.

Note that FIGS. 23 to 26 each illustrate an example in which the die bond material 40 does not enter the recess 412c for the purpose of the description. In actual, in the semiconductor device 402 which is a good product, the die bond material 40 enters each of the plurality of recesses 412a to 412f. The die bond material 40 is provided integrally over the plurality of recesses 412a to 412f.

In the present embodiment, the transparent or semitransparent semiconductor substrate 410 and the recesses 412a to 412f help to easily check the area over which the die bond material 40 is spread. Also, the appearance inspection can be performed even when the die bond material 40 does not protrude from the semiconductor chip 401. This can reduce the amount of the die bond material 40 to be applied, and the die bond material 40 can be prevented from creeping up to the upper surface of the semiconductor substrate 410. Accordingly, the reliability of the semiconductor device 402 can be improved. Furthermore, the consumption amount of the die bond material 40 can be reduced, and the manufacturing cost of the semiconductor device 402 can be reduced.

In the present embodiment, the recesses 412a to 412c extend along one long side of the semiconductor substrate 410. The recesses 412d to 412f extend along the other long side of the semiconductor substrate 410. The recesses 412a and 412d extend along one short side of the semiconductor substrate 410. The recesses 412c and 412f extend along the other short side of the semiconductor substrate 410. Thus, at least one of the plurality of recesses 412a to 412f is formed along each side of the back surface of the semiconductor substrate 410. In this way, it can be checked that the die bond material 40 is spread to each side of the back surface of the semiconductor chip 401.

Furthermore, each of the plurality of recesses 412a, 412c, 412d, and 412f is formed at the corresponding one of all the edges of the back surface of the semiconductor substrate 410 facing to the support 50. In this way, it can be checked that the die bond material 40 is spread to four corners of the back surface of the semiconductor chip 401.

The arrangement, the number and the shape of the plurality of recesses 412a to 412f may be changed according to the shape of the semiconductor chip 401 or the area in which the die bond material 40 is provided.

As a modified example of the present embodiment, the plurality of recesses 412a to 412f need not pass through the semiconductor substrate 410. It is only required that the plurality of recesses 412a to 412f is formed in the outer peripheral portion of the back surface of the semiconductor substrate 410.

It is only required that the semiconductor substrate 410 is formed from a material which makes it possible to check through the semiconductor substrate 410 whether the die bond material 40 enters the recesses 412a to 412f.

Fifth Embodiment

Figure 27A:
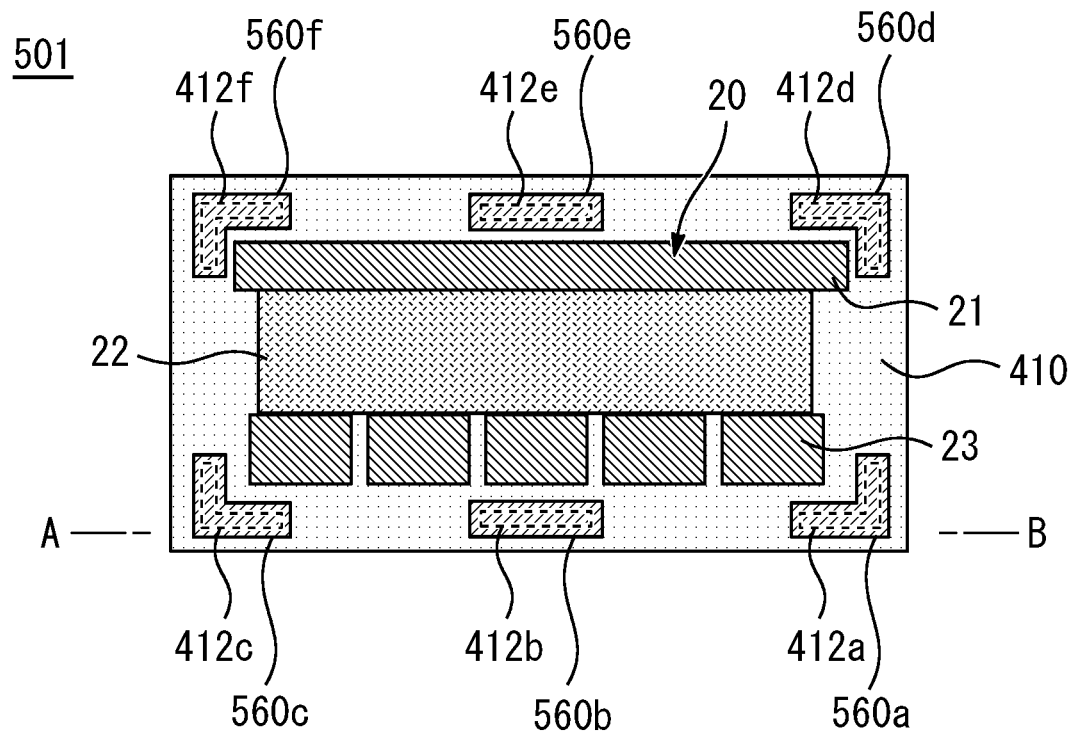
FIG. 27A is a plan view of a semiconductor chip according to the fifth embodiment.
Figure 27B:
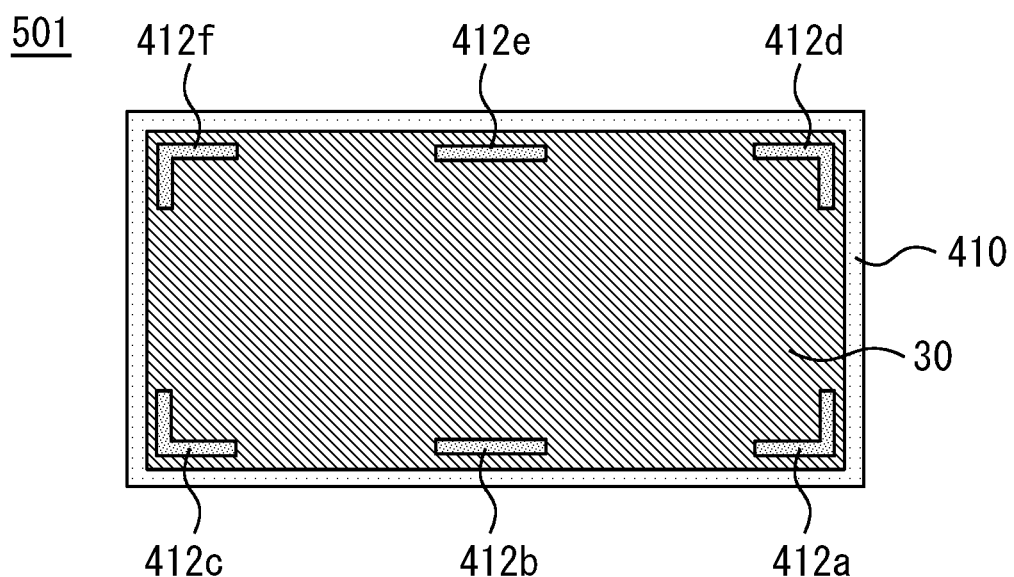
FIG. 27B is a bottom view of the semiconductor chip according to the fifth embodiment.
Figure 28:
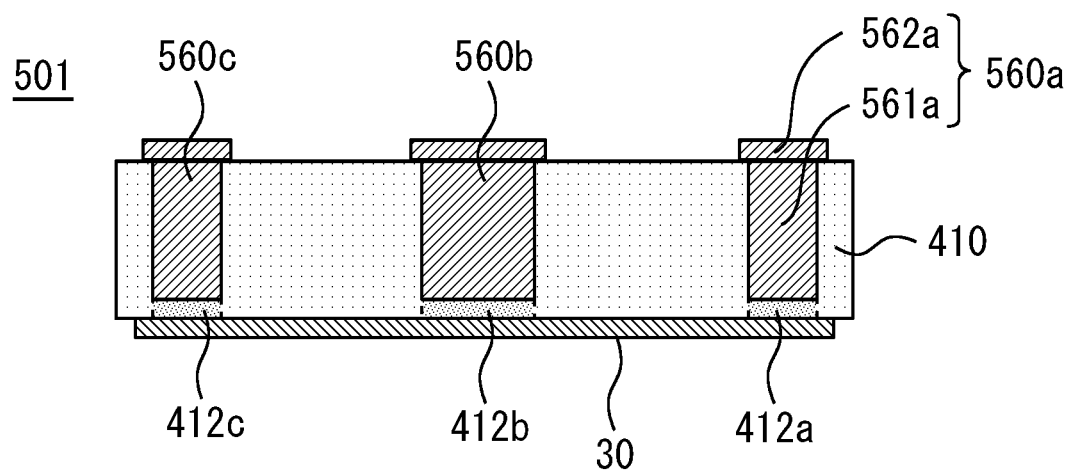
FIG. 28 is a cross-sectional view of the semiconductor chip according to the fifth embodiment.

FIG. 27A is a plan view of a semiconductor chip 501 according to the fifth embodiment. FIG. 27B is a bottom view of the semiconductor chip 501 according to the fifth embodiment. FIG. 28 is a cross-sectional view of the semiconductor chip 501 according to the fifth embodiment. FIG. 28 is the cross-sectional view taken along a straight line A-B of FIG. 27A.

Similarly to the fourth embodiment, a plurality of recesses 412a to 412f is formed in an outer peripheral portion of the semiconductor substrate 410, each of the recesses passing through the semiconductor substrate 410 from a back surface thereof to an upper surface thereof opposite to the back surface.

The semiconductor chip 501 includes a plurality of conductors 560a to 560f which is embedded in the plurality of recesses 412a to 412f from the upper surface side of the semiconductor substrate 410, respectively. Each lower end of the plurality of conductors 560a to 560f is provided between the upper surface and back surface of the semiconductor substrate 410. Each lower end of the plurality of conductors 560a to 560f is separated from the back surface of the semiconductor substrate 410. Each of the plurality of conductors 560a to 560f is separated from an electrode 20 of the semiconductor chip 501.

The conductor 560a includes a main portion 561a provided in the recess 412a and a wide portion 562a provided on the upper surface of the semiconductor substrate 410. The wide portion 562a is wider than the recess 412a. The same applies to the conductors 560b to 560f.

Figure 29:
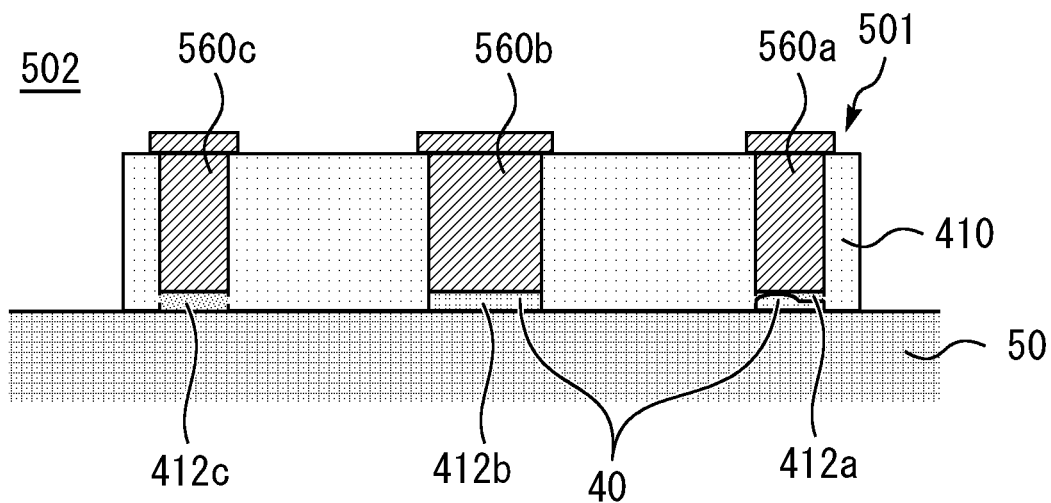
FIG. 29 is a cross-sectional view of a semiconductor device according to the fifth embodiment.

FIG. 29 is a cross-sectional view of a semiconductor device 502 according to the fifth embodiment. In the semiconductor device 502, the semiconductor chip 501 is bonded to a support 50 by a die bond material 40.

Figure 30:
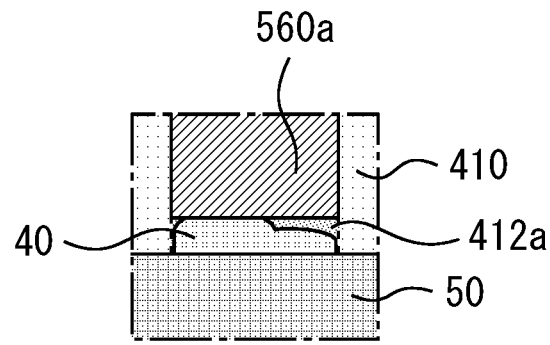
FIG. 30 is an enlarged view of the recess according to the fifth embodiment.
Figure 31:
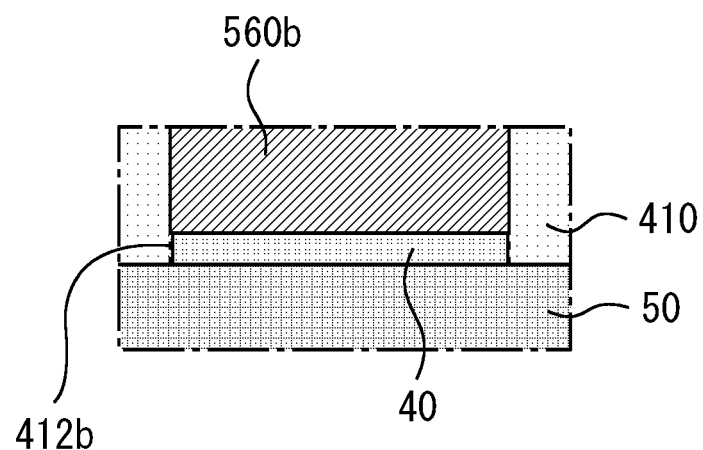
FIG. 31 is an enlarged view of the recess according to the fifth embodiment.
Figure 32:
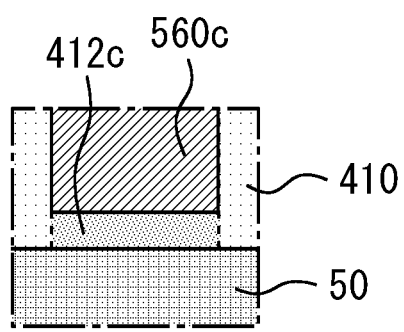
FIG. 32 is an enlarged view of the recess according to the fifth embodiment.

FIG. 30 is an enlarged view of the recess 412a according to the fifth embodiment. FIG. 31 is an enlarged view of the recess 412b according to the fifth embodiment. FIG. 32 is an enlarged view of the recess 412c according to the fifth embodiment. Also in the present embodiment, similarly to the fourth embodiment, it can be visually checked from the side surface side of the semiconductor chip 501 whether the die bond material 40 enters the recesses 412a to 412f. Accordingly, the same effect as the fourth embodiment can be obtained.

As illustrated in FIGS. 30 and 31, each of the conductors 560a and 560b contact the die bond material 40. Accordingly, the conductors 560a and 560b are electrically conductive with the support 50. On the other hand, as illustrated in FIG. 32, the conductor 560c does not contact the die bond material 40. Accordingly, the conductor 560c is not electrically conductive with the support 50.

Therefore, in the present embodiment, whether the die bond material 40 is spread to the target area in the back surface of the semiconductor chip 501 can be checked depending on whether the conductors 560a to 560f are electrically conductive with the support 50.

Note that FIGS. 29 to 32 each illustrate an example in which the die bond material 40 does not contact the conductor 560c for the purpose of the description. In actual, in the semiconductor device 502 which is a good product, the die bond material 40 contacts each of the plurality of conductors 560a to 560f. The die bond material 40 is provided integrally over the plurality of recesses 412a to 412f.

In the present embodiment, an application state of the die bond material 40 can be checked by a continuity inspection. Accordingly, a visual check process can be eliminated. When the visual check process is eliminated, the semiconductor substrate 410 need not be transparent or semitransparent. The area over which the die bond material 40 is spread may be checked by combining the continuity inspection and the appearance inspection.

Additionally, the continuity inspection can be easily performed by using the wide portion 562a as an electrode for the continuity inspection.

Note that the technical features described in the above embodiments may be combined as appropriate.

REFERENCE SIGNS LIST 1, 1a semiconductor chip, 2, 2a, 2b semiconductor device, 10 semiconductor substrate, 12a-12h cutout, 20 electrode, 21 source electrode, 22 gate electrode, 23 drain electrode, 30 back surface conductor, 40 die bond material, 50 support, 80 dicing street, 112a-112h dug hole, 201 semiconductor chip, 202 semiconductor device, 212a-212h cutout, 301 semiconductor chip, 302 semiconductor device, 312a-312d cutout, 401 semiconductor chip, 402 semiconductor device, 410 semiconductor substrate, 412, 412a-412f recess, 414 semiconductor layer, 416 via hole, 501 semiconductor chip, 502 semiconductor device, 560a-560f conductor, 561a main portion, 562a wide portion

The invention claimed is:

1. A semiconductor device, comprising:
a support;
a semiconductor chip provided on the support; and
a die bond material for bonding a back surface of the semiconductor chip to the support,
wherein a plurality of cutouts is formed at edges formed between the back surface and side surfaces of the semiconductor chip connected to the back surface,
the die bond material is one continuous piece over the plurality of cutouts, and
each of the plurality of cutouts passes through the semiconductor chip from the back surface to an upper surface opposite to the back surface.

2. A semiconductor device, comprising:
a support;
a semiconductor chip provided on the support; and
a die bond material for bonding a back surface of the semiconductor chip to the support, wherein
the semiconductor chip includes a transparent or semi-transparent semiconductor substrate provided on the support,
a plurality of recesses is formed in an outer peripheral portion of a back surface of the semiconductor substrate, the back surface facing to the support, and
the die bond material is one continuous piece over the plurality of recesses.

3. The semiconductor device according to claim 2, wherein
the die bond material enters each of the plurality of recesses.

4. The semiconductor device according to claim 2, wherein
at least one of the plurality of recesses is formed along each side of the back surface of the semiconductor substrate.

5. The semiconductor device according to claim 2, wherein
the plurality of recesses is formed at all edges of the back surface of the semiconductor substrate.

6. A semiconductor device, comprising:
a support;
a semiconductor chip provided on the support; and
a die bond material for bonding a back surface of the semiconductor chip to the support, wherein
the semiconductor chip includes a semiconductor substrate provided on the support,
a plurality of recesses is formed in an outer peripheral portion of the semiconductor substrate, each of the recesses passing through the semiconductor substrate from a back surface facing to the support to an upper surface opposite to the back surface,
the semiconductor chip includes a plurality of conductors each of which is embedded in a corresponding one of the plurality of recesses from the upper surface side of the semiconductor substrate, and
the die bond material is one continuous piece over the plurality of recesses.

7. The semiconductor device according to claim 6, wherein
each of the plurality of conductors contacts the die bond material.

8. The semiconductor device according to claim 6, wherein
each of the plurality of conductors is separated from an electrode of the semiconductor chip.

9. The semiconductor device according to claim 3, wherein
at least one of the plurality of recesses is formed along each side of the back surface of the semiconductor substrate.

10. The semiconductor device according to claim 3, wherein
the plurality of recesses is formed at all edges of the back surface of the semiconductor substrate.

11. The semiconductor device according to claim 4, wherein
the plurality of recesses is formed at all edges of the back surface of the semiconductor substrate.

12. The semiconductor device according to claim 9, wherein
the plurality of recesses is formed at all edges of the back surface of the semiconductor substrate.

13. The semiconductor device according to claim 7, wherein
each of the plurality of conductors is separated from an electrode of the semiconductor chip.

* * * * *